United States Patent
Takahashi

(10) Patent No.: US 6,746,239 B2
(45) Date of Patent: Jun. 8, 2004

(54) SUBSTRATE FEED CHAMBER AND SUBSTRATE PROCESSING APPARATUS

(75) Inventor: Nobuyuki Takahashi, Kanagawa (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 10/252,392

(22) Filed: Sep. 24, 2002

(65) Prior Publication Data
US 2003/0061730 A1 Apr. 3, 2003

(30) Foreign Application Priority Data
Sep. 28, 2001 (JP) ........................................ 2001-301053

(51) Int. Cl.⁷ ................................................. F27D 3/00
(52) U.S. Cl. ...................... 432/121; 432/253; 432/258; 414/217; 414/935
(58) Field of Search .......................... 432/5, 6, 11, 121, 432/122, 253, 258; 392/418; 118/724, 725, 728, 500; 414/217, 935

(56) References Cited
U.S. PATENT DOCUMENTS
5,971,696 A * 10/1999 Endo et al. ................. 414/778

FOREIGN PATENT DOCUMENTS
JP 69316 11/1994
JP 3744 9/1996

* cited by examiner

*Primary Examiner*—Jiping Lu
(74) *Attorney, Agent, or Firm*—Venable LLP; James R. Burdett; W. Russell Swindell

(57) ABSTRACT

A substrate feed chamber that is equipped in a substrate processing apparatus is provided. The substrate feed chamber has a storage tray capable of storing simultaneously three or more substrate holding trays that hold substrates in a vertical or substantially vertical condition and a horizontal movement mechanism that moves horizontally the storage tray with respect to the substrate feed position in order to effect feeding-in or feeding-out movement of the substrate holding tray between any of the chambers of a group consisting of processing chambers and load lock chambers and, in addition, if required, has a rotary movement device that rotates the storage tray. Improvement in throughput in a substrate processing apparatus can thereby be achieved and increase in the ground-contacting area of the device as a whole can be prevented.

29 Claims, 15 Drawing Sheets

Substrate  Substrate

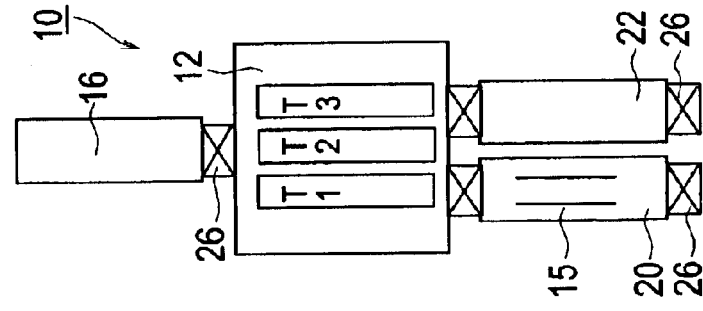
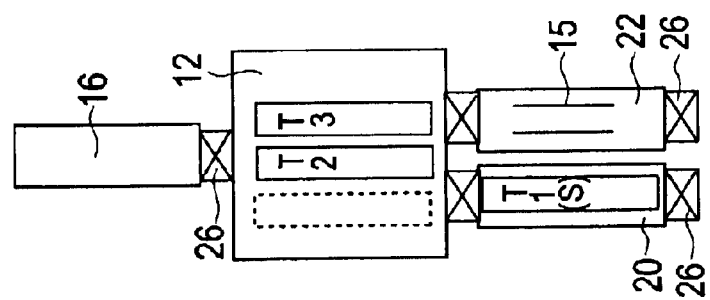
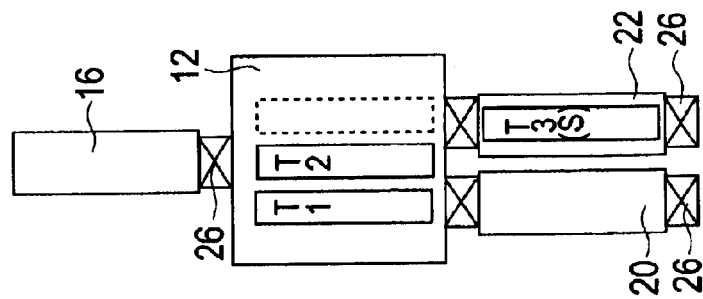
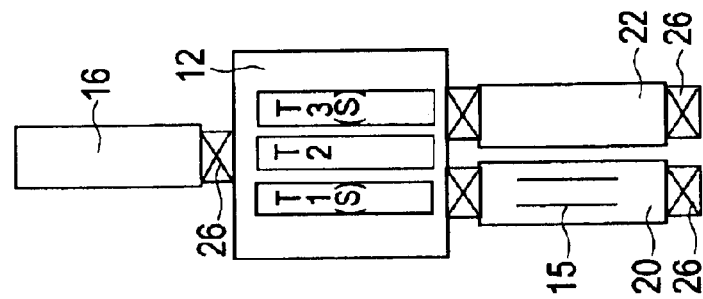
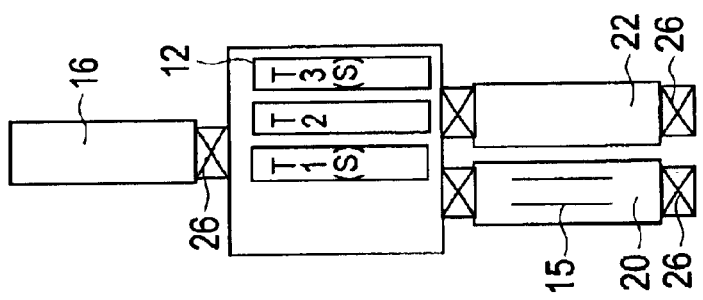

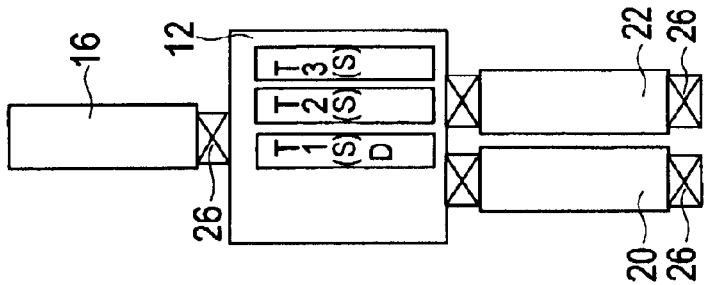
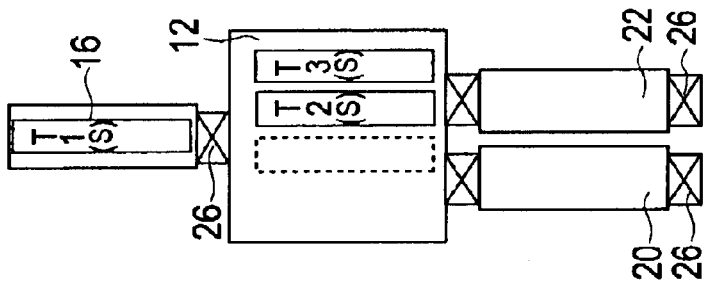
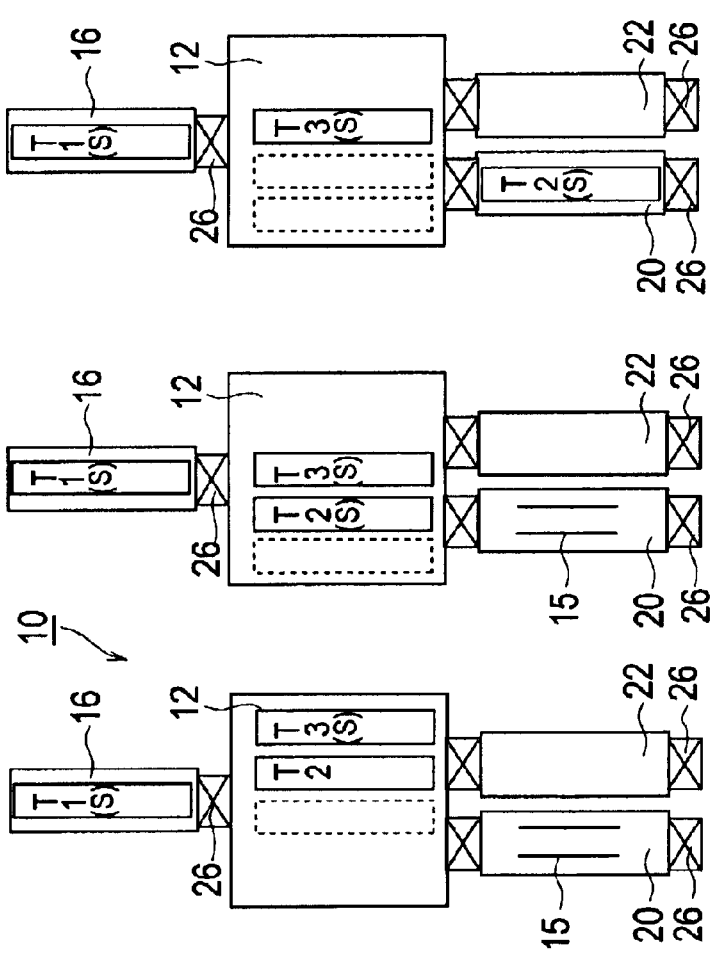

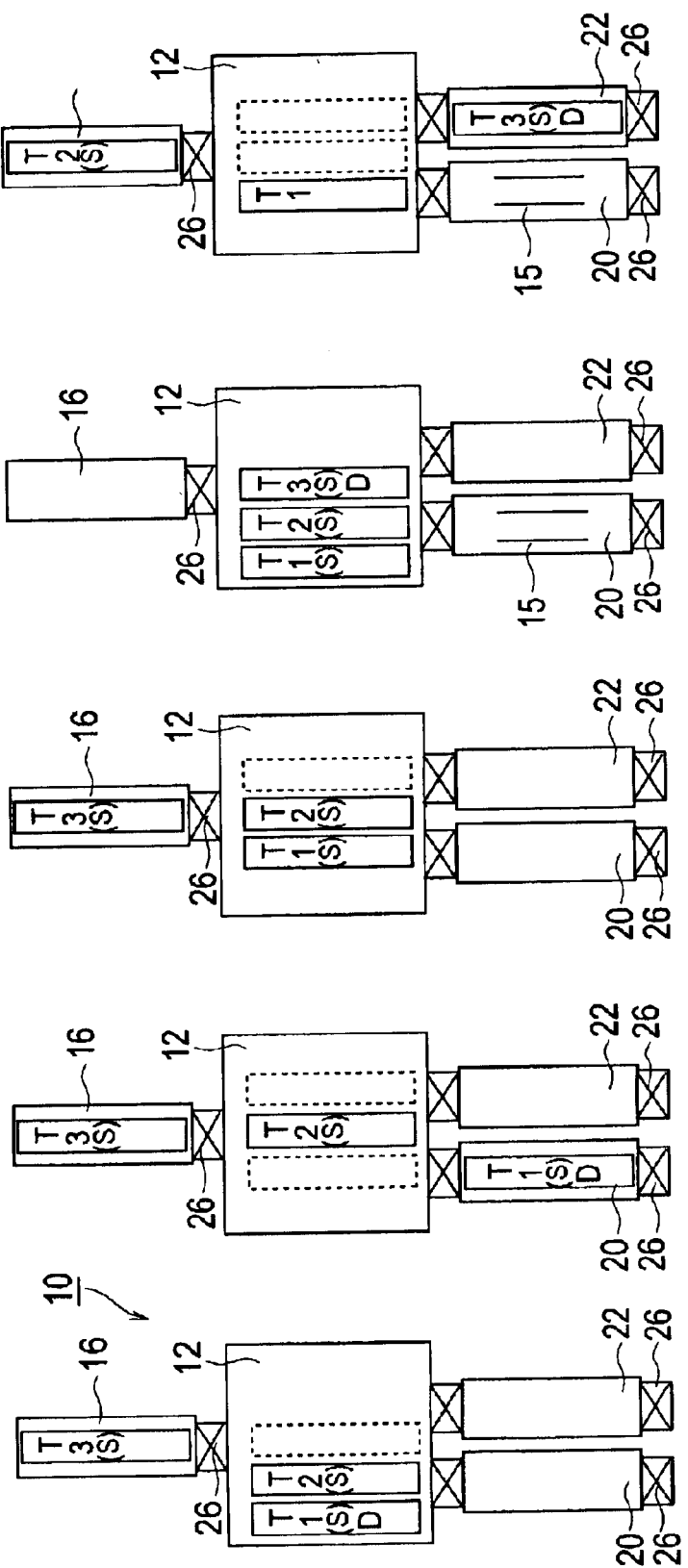

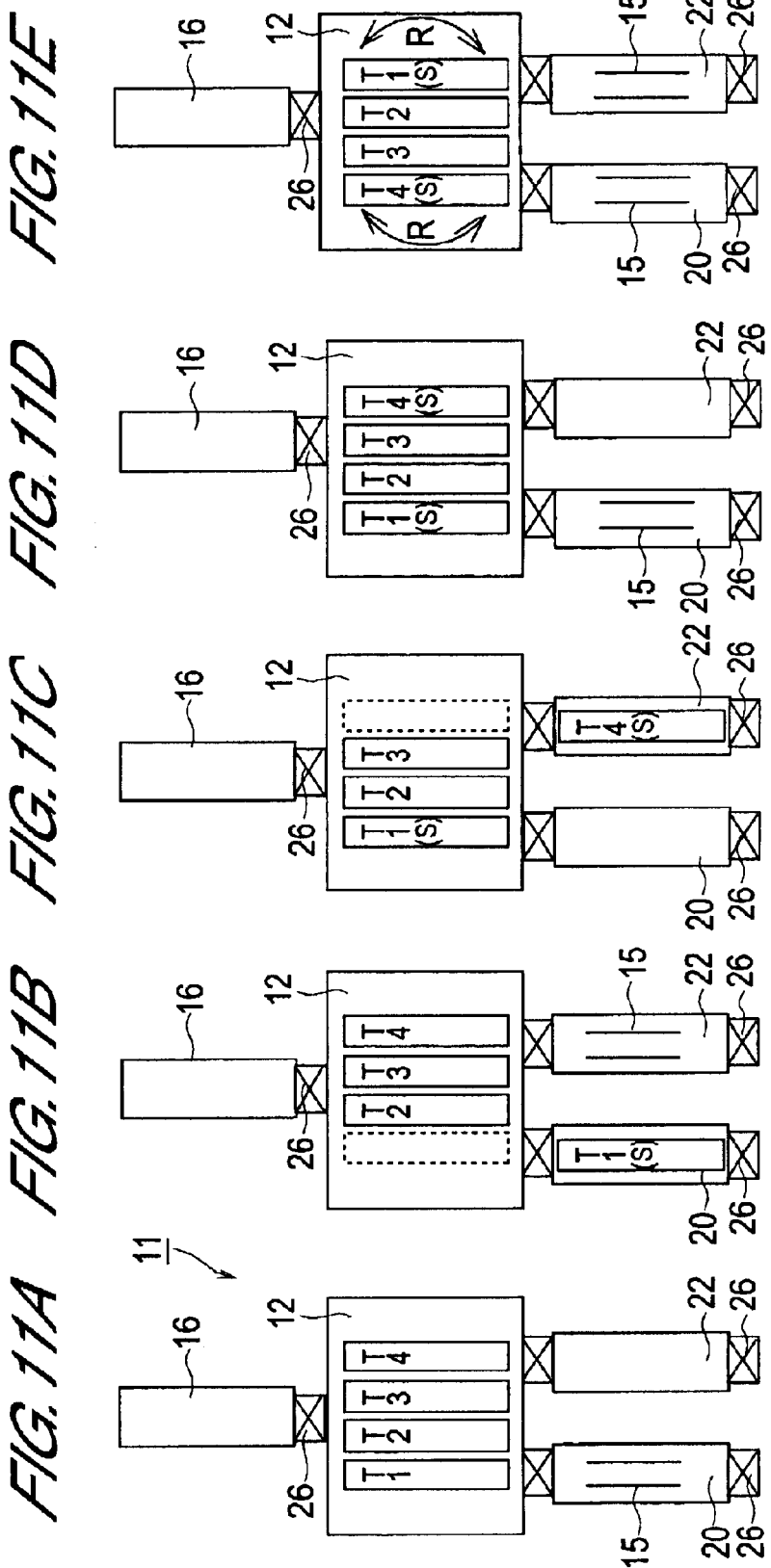

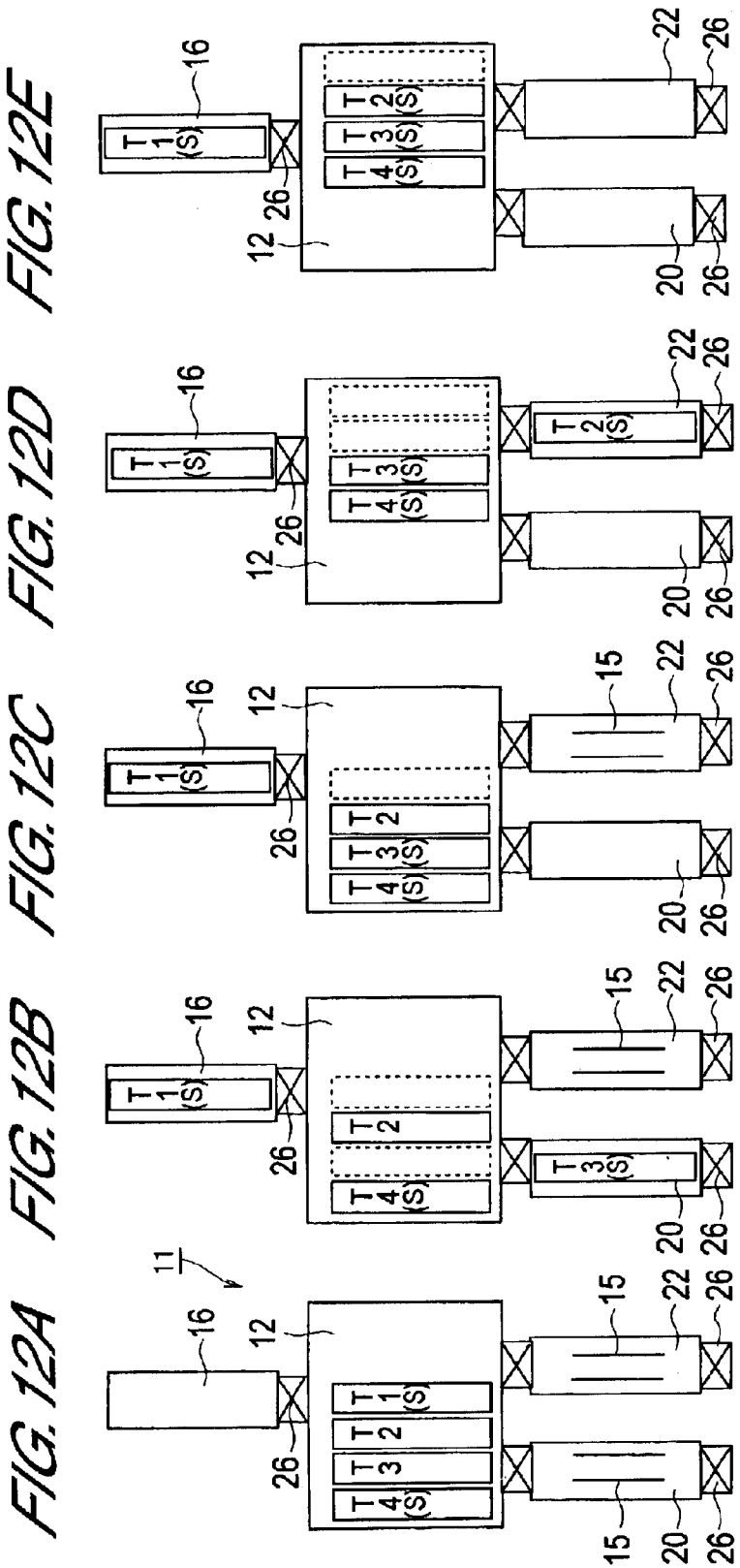

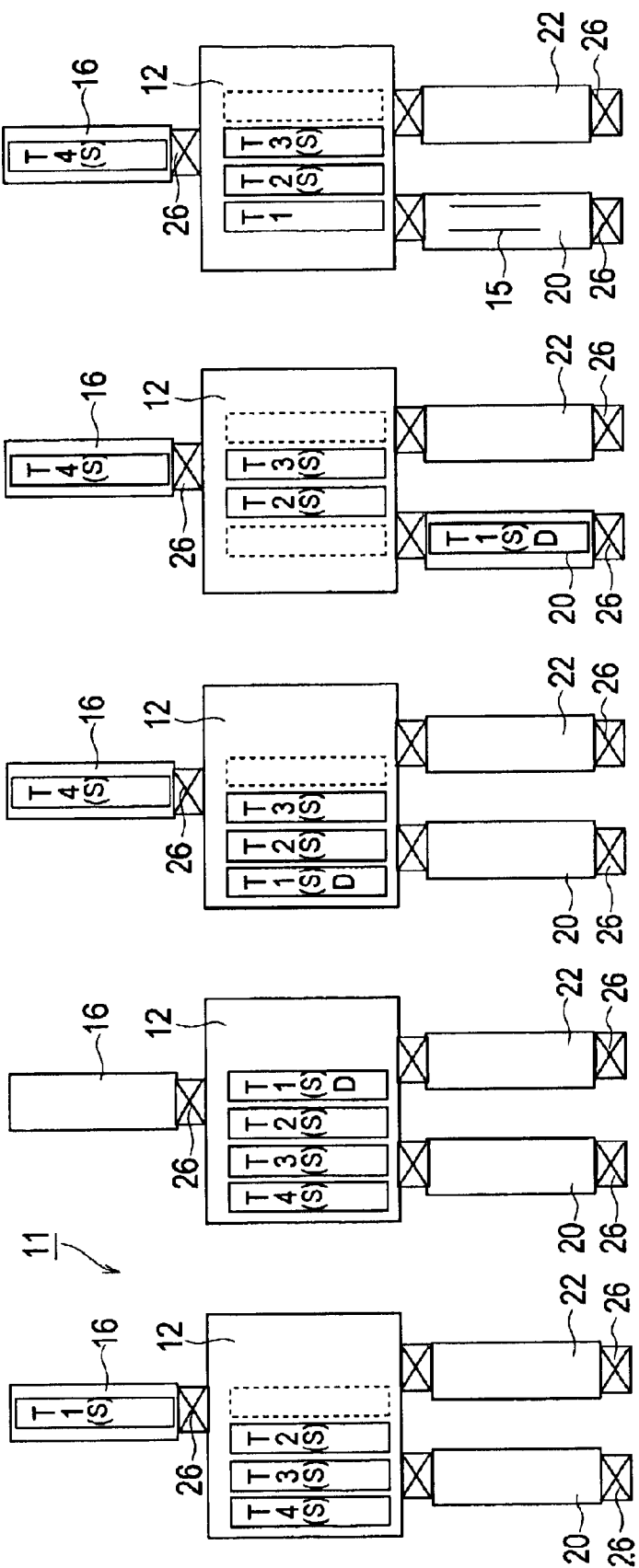

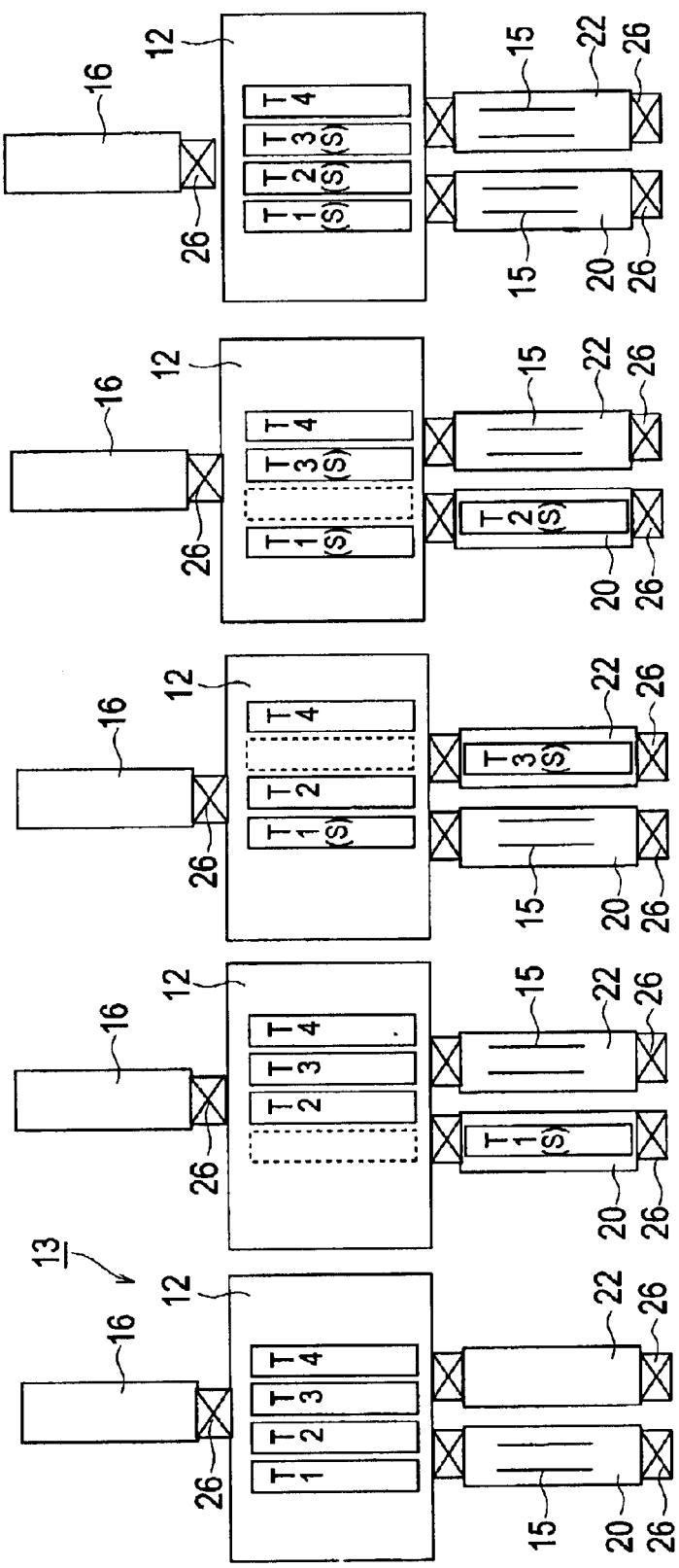

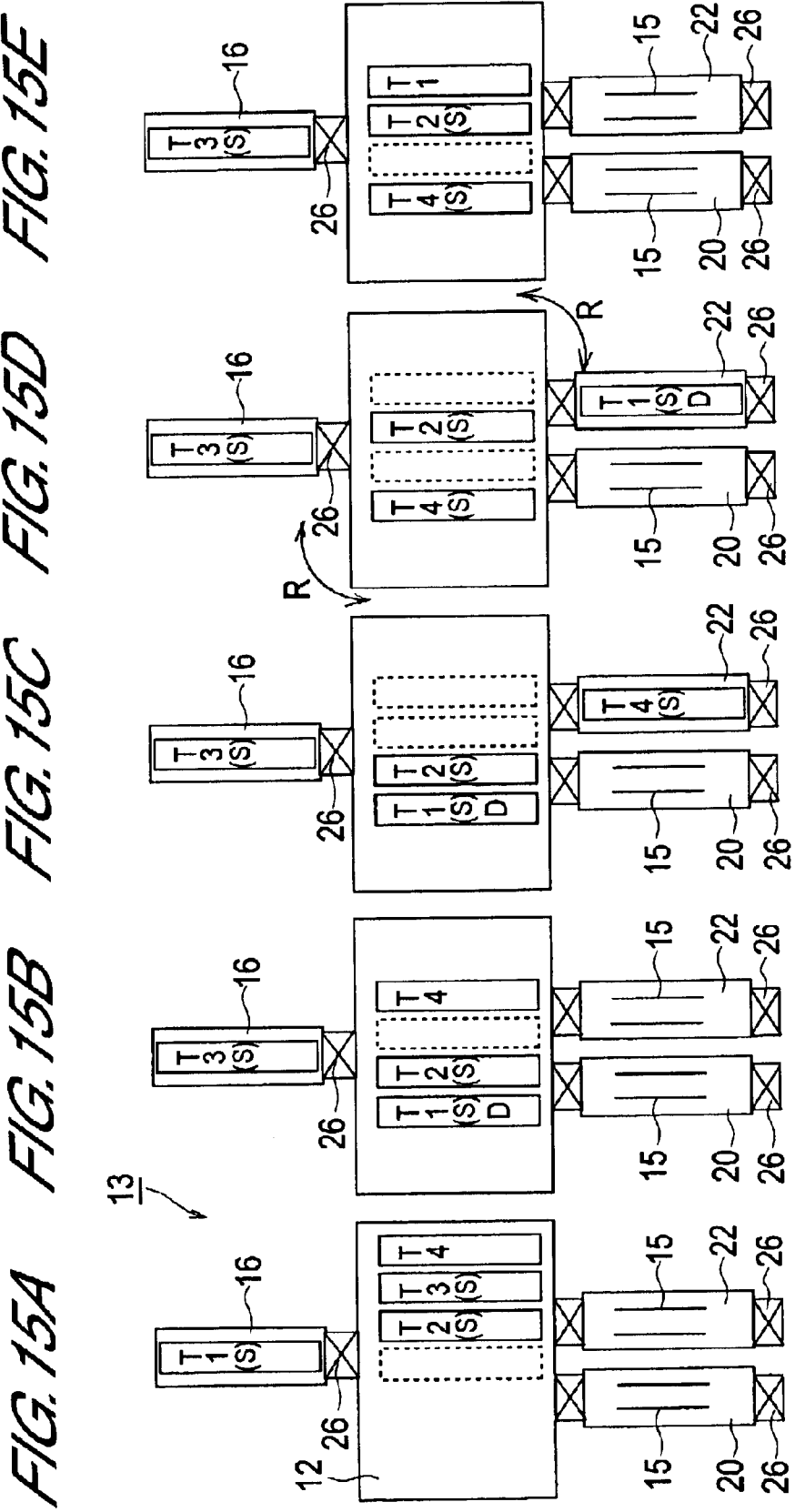

SUBSTRATE FEED CHAMBER AND SUBSTRATE PROCESSING APPARATUS

BACKGROUND OF THE INVENTION

1. Field of the Invention

The present invention relates to a substrate feed chamber and substrate processing apparatus suitable for use in manufacturing display devices such as liquid-crystal displays.

2. Description of Related Art

In the manufacture of display devices of various types such as liquid-crystal displays, the substrate processing apparatus (vacuum processing device) that performs the surface processing etc on the substrate typically comprises chiefly a load lock chamber wherein feeding-in and feeding-out of the substrate is performed between atmospheric atmosphere and vacuum atmosphere, a processing chamber wherein prescribed deposition treatment, etching, or heat treatment involving heating or cooling etc are performed on the substrate, and a feed chamber whereby the substrate is fed to a load lock chamber or processing chamber.

Previously, as an example of a typical substrate processing apparatus, there has been disclosed in Reference 1 (Laid-Open Japanese Patent Application Number H. 6-69316) a substrate processing apparatus wherein a single substrate holding tray that holds a single substrate is fed into a process chamber (corresponding to the processing chamber), a pre-heating chamber and pre-cooling chamber through a feed chamber capable of accommodating a single substrate-holding tray.

Also, in Reference 2 (Laid-Open Japanese Patent Application Number H. 8-3744) there has been disclosed a substrate processing apparatus whereby a single substrate carrier (corresponding to the substrate holding tray) that holds a single substrate is fed to a process chamber (corresponding to the processing chamber), load lock chamber and unload lock chamber (corresponding to load lock chambers) through a buffer chamber (corresponding to the feed chamber) capable of accommodating simultaneously two substrate carriers.

In recent years, there has been a marked trend to increasing substrate size, due to trends such as increasing the size of display screens of liquid-crystal displays etc and manufacturing and using as products several substrates from a single large substrate.

However, with increase in substrate size, the volume occupied by the chambers constituting the device necessarily becomes large.

Consequently, due to increase in size of the substrate processing apparatus itself that is used to handle these substrates, operating costs of the device are also increased.

Also, when the size of the substrate processing apparatus is increased running costs are increased, due for example to the need for a long time in order to ensure prescribed processing conditions of the substrate in deposition processing etc.

Furthermore, when holding a substrate of large dimensions in a horizontal position, there is a risk of flexure due to the weight of the substrate itself. If deposition processing etc is performed in this flexed condition, processing becomes uneven, so the reliability of the product tends to be adversely affected by unevenness of the display etc.

Also, storage and management of the device become difficult due to increase in size of the substrate processing apparatus.

Device design aiming at suppressing increase of installation area (footprint) and improving throughput taking into consideration increases in substrate size in recent years is therefore necessary.

However, in the substrate processing apparatus disclosed in Reference 1, a dedicated heating chamber for heating (preheating) prior to deposition processing of the substrate was separately provided. With such a construction, the area occupied by the device was further increased and this was also undesirable from the point of view of improving throughput.

Also, in the case of the substrate processing apparatus disclosed in Reference 2, due to restrictions on the number of substrates when storing substrates that were stored in another processing chamber in the buffer chamber, the efficiency of the feeding-in and feeding-out operation is poor, so that improved throughput cannot be achieved.

The discovery of a technique for solving the various technical problems described above was therefore desired.

SUMMARY OF THE INVENTION

A first object of the present invention is to provide a substrate feed device whereby the operation of feeding in/out of substrates can be made more efficient and throughput improved.

A second object of the present invention is to provide a substrate feed device of a construction wherein increase of the area occupied by the substrate processing apparatus can be restricted.

A third object of the present invention is to provide a method of feeding and processing of substrates by means of a substrate feed device as described above.

Accordingly, a substrate feed chamber according to the present invention possesses the following structural features.

Specifically, a substrate feed chamber according to the present invention comprises substrate holding tray storage device and a horizontal movement mechanism. The substrate holding tray storage device is made capable of storing simultaneously three or more substrate holding trays that hold substrates in a vertical or substantially vertical condition. Also, the horizontal movement mechanism moves this substrate holding tray storage device horizontally.

Thus the horizontal movement mechanism in this substrate feed chamber effects horizontal movement with respect to the substrate feed position for performing feeding-in or feeding-out movement of the substrate holding tray between any of the chambers of a group of chambers of one or two or more substrate processing chambers where prescribed processing is performed on the substrates and one or two or more load lock chambers where feeding in/out of the substrates between atmospheric atmosphere and vacuum atmosphere is performed.

By adopting such a construction of the substrate feed chamber, more substrates than conventionally can be simultaneously stored in the substrate feed chamber. Also, since usually the substrate processing chambers comprise one or more chambers and the load lock chambers also comprise one or more chambers, combining both of these, the substrate processing apparatus comprises two or more chambers.

Consequently, substrate feeding-in or feeding-out movement by this horizontal movement mechanism between any of the chambers of the group of chambers comprising the substrate processing chambers and load lock chambers can be performed in a smooth fashion without making the substrates wait unnecessarily.

Thus throughput can be improved by performing substrate feeding in and out in an efficient manner.

Also, thanks to the adoption of a construction whereby the substrates are fed in a vertical or substantially vertical condition, the space in the horizontal plane can be reduced compared with the case where the substrates are fed in a horizontally arranged condition (hereinbelow simply referred to as a horizontal condition). Consequently, apart from the substrate feed chamber itself, the area of installation of the substrate processing apparatus as a whole (i.e. its footprint) comprising this substrate feed chamber can be reduced.

Also, since flexure of the substrates due to the weight of the substrates produced if the substrates are held in horizontal condition can be prevented, non-uniformity etc. of processing of the substrate surfaces can be prevented.

Also, preferably, the substrate feed chamber is provided with a rotary movement mechanism. This rotary movement mechanism is of a construction whereby positional location of the substrate holding tray storage device to the substrate feed position either by the rotary movement mechanism alone or in combination with the horizontal movement mechanism can be achieved, by rotating the substrate holding tray storage device about an axis perpendicular to the horizontal movement plane of the horizontal movement mechanism.

In this way, feeding of substrates between all of the substrate processing chambers, between the load lock chambers or between the substrate processing chambers and load lock chambers that are connected with the substrate feed chamber (i.e. feeding-in or feeding-out) can be performed even more efficiently, so further increase in throughput can be achieved.

Also, preferably, the substrate holding tray storage device in the substrate feed chamber is constituted divided into a plurality.

In this way, it is possible to selectively drive only a substrate holding tray storage device on which substrates to be fed are provided with respect to both or either of the load lock chambers and processing chambers. In this way, the substrate feed operation can be separated by proceeding with a plurality of operations simultaneously, so the feed operation can be performed in an efficient fashion.

Also, preferably, the substrate feed chamber comprises heating device that heats the substrates.

If this is done, substrate heating can be achieved without providing a dedicated heating chamber or a processing chamber etc comprising heating device, so space-saving of the substrate processing apparatus can be achieved.

Also, preferably, the substrate feed chamber comprises cooling device that cools the substrate.

If this is done, substrate cooling can be achieved without providing a dedicated cooling chamber or a processing chamber etc comprising cooling device, so space-saving of the substrate processing apparatus can be achieved.

Also, preferably, two substrates are held by the substrate holding tray.

If this is done, at least six substrates can be stored simultaneously.

The substrate processing apparatus according to the present invention is of a construction comprising a substrate feed chamber as described above. Also, the substrate processing chamber is of a construction whereby two substrates held on a substrate holding tray can be simultaneously processed.

BRIEF DESCRIPTION OF THE DRAWINGS

The foregoing and other objects, features and advantages of the present invention will be better understood from the following description taken in connection with accompanying drawings, in which:

FIGS. 8A to 8E are views given in explanation of the operation of a substrate processing apparatus according to the first embodiment;

FIGS. 9A to 9E are views given in explanation of the operation of a substrate processing apparatus according to the first embodiment, continuing from FIG. 8E;

FIGS. 10A to 10E are views given in explanation of the operation of a substrate processing apparatus according to the first embodiment, continuing from FIG. 9E;

FIGS. 11A to 11E are views given in explanation of the operation of a substrate processing apparatus according to the second embodiment;

FIGS. 12A to 12E are views given in explanation of the operation of a substrate processing apparatus according to the second embodiment, continuing from FIG. 11E;

FIGS. 13A to 13E are views given in explanation of the operation of a substrate processing apparatus according to the second embodiment, continuing from FIG. 12E;

FIGS. 14A to 14E are views given in explanation of the operation of a substrate processing apparatus according to a third embodiment; and FIGS. 15A to 15E are views given in explanation of the operation of a substrate processing apparatus according to the third embodiment, continuing from FIG. 14E.

DESCRIPTION OF THE PREFERRED EMBODIMENTS

Figure 1A:
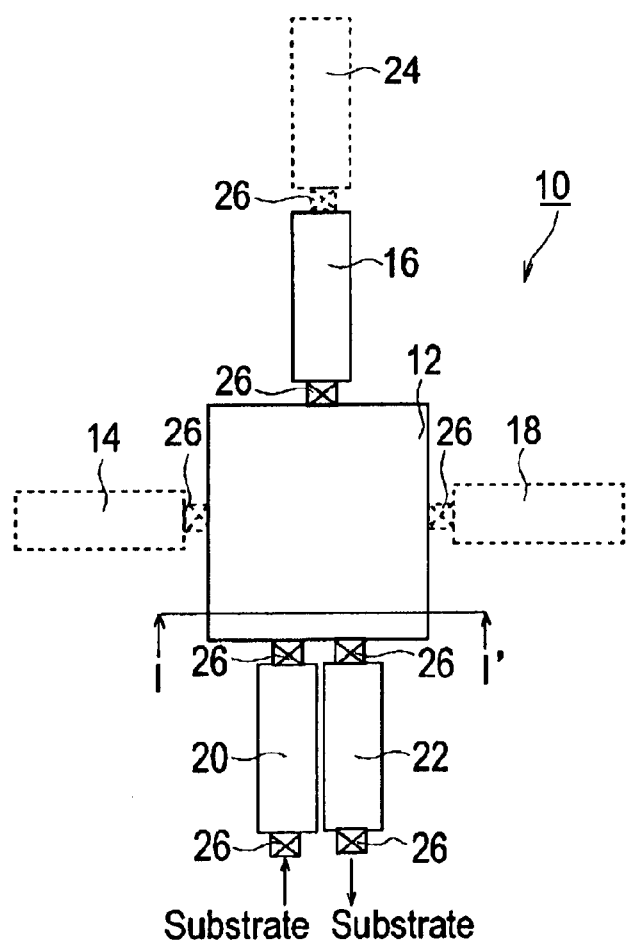
FIG. 1A is a diagrammatic plan view of an example of the construction of a substrate processing apparatus according to a first embodiment of the present invention.

Embodiments of the present invention are described below with reference to the drawings. It should be noted that the drawings merely illustrate diagrammatically the size of the structural components and their arrangement relationships to an extent such as to enable the invention to be understood; the present invention is therefore not restricted solely to the illustrated examples. Also, in the drawings employed in the description, identical structural components are given the same reference symbols and repeated description thereof may be omitted.

First Embodiment

Figure 1B:
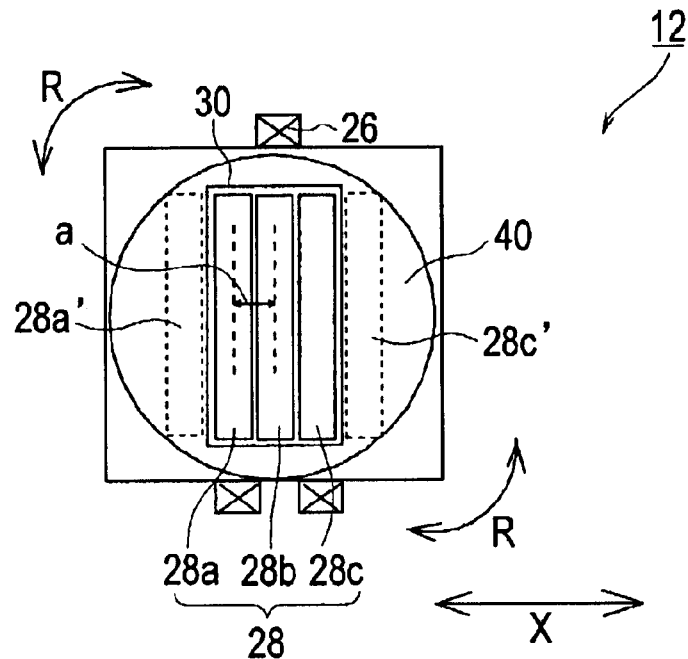
FIG. 1B is a diagrammatic plan view given in explanation of a substrate feed chamber according to a first embodiment of the present invention.

FIGS. 1A and 1B are views illustrating diagrammatically an example of the construction of a first substrate processing apparatus 10 according to the present invention. FIG. 1A is a diagrammatic plan view of a first substrate processing apparatus 10 while FIG. 1B is a diagrammatic plan view given in explanation of substrate feed chamber 12 shown in FIG. 1A.

1. Description of a Substrate Processing Apparatus According to the Present Invention As shown in FIG. 1A, the first substrate processing apparatus 10 comprises a substrate feed chamber 12 that feeds a substrate mounted on a substrate holding tray respectively into a substrate processing chamber 16 and load lock chambers (20, 22). It should be noted that the substrate is not illustrated in FIG. 1A but is illustrated in the drawings subsequently referred to.

Specifically, substrate processing chamber 16 for performing prescribed processing on the substrate, first load lock chamber 20 for feeding-in the substrate and second load lock chamber 22 for feeding-out the substrate are arranged adjacent to substrate feed chamber 12. It should be noted that first and second load lock chambers (20, 22) could serve both for feeding-in and feeding-out the substrate without distinction between feeding-in and feeding-out.

Also, passage between this substrate processing chamber 16 and substrate feed chamber 12 and passage between the first and second load lock chambers (20, 22) and feed chamber 12 is gated by a gate valve 26 through which the substrate can be fed in or out and that isolates the chambers.

A gate valve 26 is also provided between the first and second load lock chambers (20, 22) and the atmosphere side (load station: described in detail later (not shown)).

Also, an evacuation system, not shown is connected to chambers (12, 16, 20 and 22) so that a prescribed degree of vacuum is maintained in the respective chambers by this evacuation system. For this evacuation system, for example a turbo molecular pump or cryo pump etc could be employed. The load station provided outside first and second load lock chambers (20, 22) has the function of placing unprocessed substrates within a load lock chamber (20, 22) or of recovering processed substrates from a load lock chamber (20, 22).

Also, although in the construction described above, a single substrate processing chamber 16 is connected with substrate feed chamber 12, if a rotary construction is provided, as will be described later, further substrate processing chambers (14, 18, 24) could additionally be provided as indicated by the dotted lines in FIG. 1 in accordance with the type of processing of the substrate.

Also, in this first substrate processing apparatus 10, heating device or means could be provided for the substrate in first load lock chamber 20. Also, cooling device or means for the substrate could be provided in second load lock chamber 22. The heating means or cooling means could be mounted on the walls of the respective chambers or could be provided within the chambers; other mounting locations are outside the scope of the present invention and will not therefore be specifically described. These heating or cooling means are operated in accordance with the processing conditions of the substrate.

As the heating means, there may be employed suitable direct or indirect heating means such as for example a gas supply system that supplies heated gas and an evacuation system for evacuating this gas, a heater, heating pipe or heat pump etc. Also, as the cooling means, there may be employed suitable cooling means such as for example a supply system that supplies cooling gas and an evacuation system for evacuating this gas or a cooling stage provided with a coolant circulating section.

Also, a substrate holding tray (not shown) may be fed by operation of a feed system (not shown) provided respectively linking substrate feed chamber 12, substrate processing chambers 16, first load lock chamber 20 and second load lock chamber 22.

2. Description of the Substrate Feed Chamber of the Present Invention

A detailed description of a substrate feed chamber according to the present invention is given below.

2-1. Outline of the Horizontal Movement Mechanism with Which the Substrate Feed Chamber is Provided (for Details, Refer to 2-4)

The substrate feed chamber 12 of the present invention, as shown in FIG. 1B, is of a construction comprising a horizontal movement mechanism (described in detail later) for effecting the movement in the horizontal direction (X direction) of a storage tray 30 constituting substrate holding tray storage device or means. The storage tray 30 is constituted so as to be capable of storing at the same time at least three (three shown by way of example in this case) substrate holding trays 28.

A storage tray 30 can be moved by the horizontal movement mechanism to a substrate feed position at which feeding in/out of substrate holding trays is performed, between any of the group of chambers comprising the substrate processing chamber and load lock chambers. Also, in this embodiment, storage trays 30 are of a construction capable of storing in a parallel arrangement three first to third storage holding trays (28a, 28b, 28c). In addition, the horizontal movement mechanism of the present invention, by means of this mechanism, is capable of moving a storage tray 30 from its initial position (described in detail below) in the horizontal direction (X direction) by an amount corresponding to an integral multiple of ±0.5 unit. In this embodiment, the horizontal movement mechanism is of a construction capable of effecting movement by +1 unit i.e. by one step to left and right respectively.

As shown in FIG. 1B, the distance between the centers of the adjacent substrate holding trays is taken as 1 unit (however, FIG. 1B is shown only diagrammatically and does not depict the precise arrangement relationship).

Also, the initial position of storage tray 30 in substrate feed chamber 12 may be set at will; however, in this description, it will be assumed that the initial position, as one example, is the central position in which movement can be effected by one step to left and right i.e. the position of the storage tray 30 shown in FIG. 1B.

Specifically, by means of the horizontal movement mechanism described above, when a storage tray 30 is moved by −1 unit in the horizontal direction from the initial position (1 unit in the leftwards direction in the plane of the drawing), substrate holding tray 28a is arranged at 28a'; when moved by +1 unit (1 unit in the rightwards direction in the horizontal direction from the initial position, substrate holding tray 28c is arranged at 28c'.

2-2 Outline of the Rotary Movement Mechanism with Which the Substrate Feed Chamber is Provided (for Details see 2-4)

The substrate feed chamber of the present invention is further provided with a rotary movement mechanism. The rotary movement mechanism (described in detail later) is capable of rotating this storage tray 30 about an axis perpendicular to the plane of horizontal movement of the horizontal movement mechanism and of moving the substrate feed position where feeding-in and feeding-out of a substrate holding tray is performed.

Specifically, the construction is one in which feeding in or out of a substrate with respect to either or both of substrate processing chamber 16 and load lock chambers (20, 22) that are arranged at the periphery of feed chamber 12 can be performed by rotating storage tray 30 by rotating a rotary base 40 (see FIG. 1B) in the rotary movement mechanism in the forwards or backwards direction (360°) R about an axis perpendicular with respect to the plane of horizontal movement of the horizontal movement mechanism. The loading surface where storage tray 30 is loaded on to this rotary base 40 lies within the horizontal plane. Horizontal movement of storage tray 30 is performed by the horizontal movement mechanism in this horizontal plane. This horizontal plane constitutes the horizontal movement plane of the horizontal movement mechanism.

2-3. Method of Feeding In/Out of the Substrate by the Horizontal Movement Mechanism If the "substrate feed position at which feeding-in or feeding-out movement of the substrate can be performed (hereinbelow called simply the substrate feed position)" described above, when substrate feeding in/out is performed by the horizontal movement mechanism and rotary movement mechanism described above, is between the substrate feed chamber 12 and substrate processing chamber 16, it corresponds to the position of the substrate holding tray 28b at the initial position of storage tray 30, as shown in FIG. 1B.

Thus the substrate holding trays can be moved by arranging a desired substrate holding tray in the position of substrate holding tray 28b by means of the horizontal movement mechanism and rotary movement mechanism and linking this with a feed system (not shown) with which the substrate holding tray and substrate processing chamber 16 are provided.

Also, if this is between the substrate feed chamber 12 and first load lock chamber 20, the substrate feed position corresponds to the position of substrate holding tray 28a at the initial position of storage tray 30.

Also, if this is between the substrate feed chamber 12 and second load lock chamber 22, the substrate feed position corresponds to the position of substrate holding tray 28c at the initial position of storage tray 30.

Thus, as described above, these substrate holding trays are made moveable by arranging the substrate holding tray in the position of substrate holding tray 28a or 28c by means of the horizontal movement mechanism and rotary movement mechanism and linking up with a feed mechanism with which the substrate holding tray and a first load lock chamber 20 or second load lock chamber 22 are provided.

The substrate feed position in substrate feed chamber 12 is not restricted to those described above but could be altered at will, depending on the construction or scale of the device.

2-4. Details of the Construction of the Substrate Feed Chamber

Next, details of the construction of substrate feed chamber 12 described above provided with the first substrate processing chamber 10 will be described with reference to FIG. 2 and FIG. 3.

Figure 2:
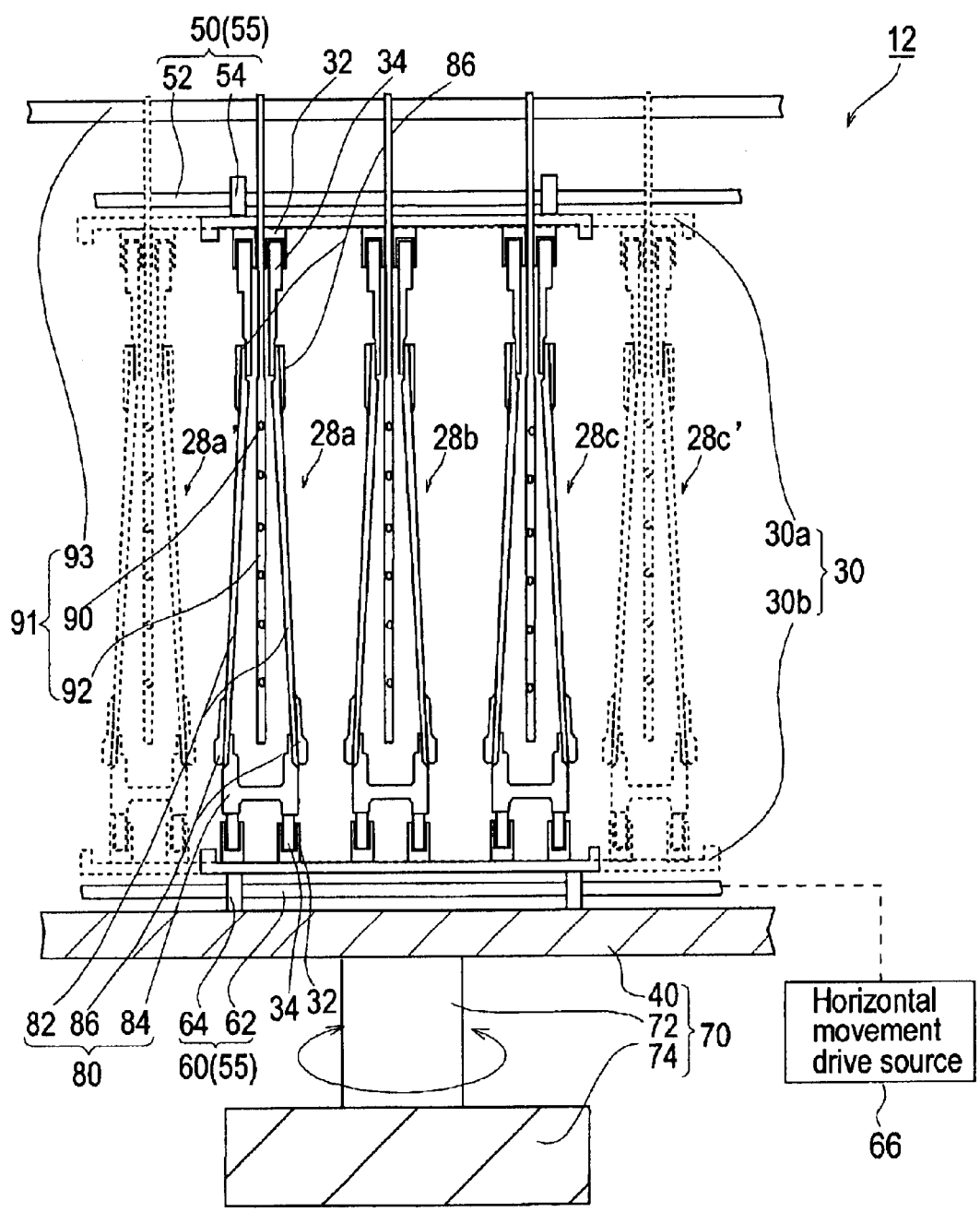
FIG. 2 is a diagrammatic partial cross-sectional view of a substrate feed chamber according to a first embodiment, sectioned along the line I–I' of FIG. 1A.
Figure 3:
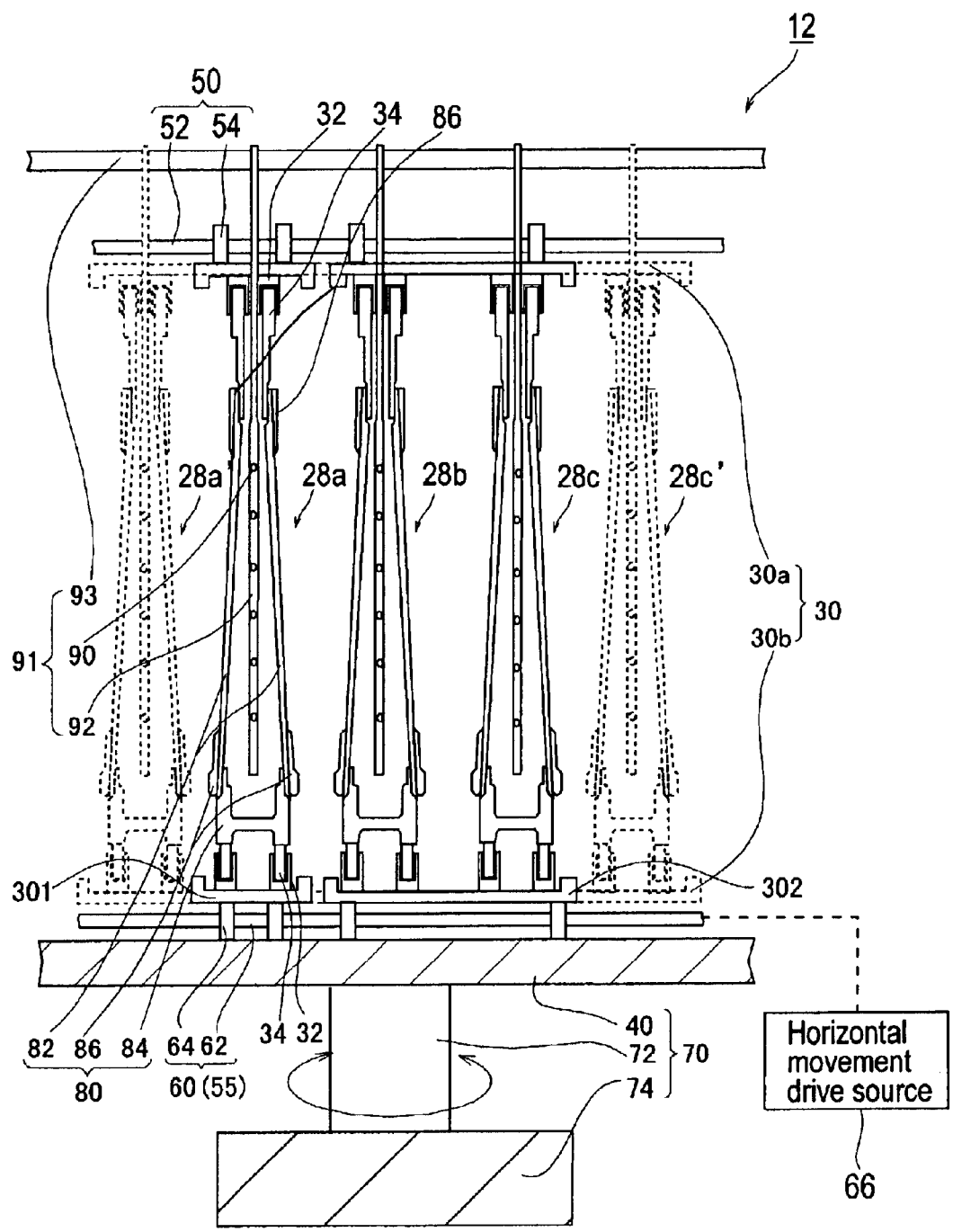
FIG. 3 is a diagrammatic partial cross-sectional view of a modified example of the substrate feed chamber of the first embodiment, similar to FIG. 2.

FIG. 2 and FIG. 3 are partial cross-sectional diagrams given in explanation of an example of the arrangement within substrate feed chamber 12, sectioned along the line I–I' of FIG. 1A. As shown in FIG. 2, storage tray 30 is constructed storing all of the substrate support trays 28 in a mutually substantially parallel condition but, as will be clear from the specific example of the operation of the substrate processing apparatus, to be described, it is not the case that all of the substrate support trays 28 are always stored in storage tray 30. The construction of substrate feed chamber 12 illustrated in FIG. 2 is the same in the case of the second and third substrate processing apparatuses (11 and 13), to be described.

Also, the present invention is applicable not merely to an arrangement in which the storage tray 30 provided in substrate feed chamber 12 is constituted as a single constituent element but also to arrangement in which the single storage tray 30 is divided into a plurality. In the case in which storage tray 30 is constituted by a plurality of two or more such constituent elements, it is possible to selectively drive only the storage tray that is provided with a desired substrate holding tray, so the feed operation of the substrates can be conducted more efficiently (see FIG. 3). In FIG. 3, substrate holding tray 28a is stored in storage tray 301 and substrate holding tray 28b and 28c are stored in storage tray 302.

2-4-1. Construction of the Horizontal Movement Mechanism

As shown in FIG. 2, within substrate feed chamber 12, there is provided a storage tray 30 constituted of an upper storage tray 30a and lower storage tray 30b such as to clamp substrate holding trays 28 from above and below.

Thus, upper horizontal movement mechanism 50 (described in detail later) is provided on the upper side of upper storage tray 30a while lower horizontal movement mechanism 60 (described in detail later) is provided on the lower side of lower storage tray 30b, the horizontal movement mechanism 55 being constituted by these two mechanisms (50 and 60). It should be noted that, although it is not necessarily essential to provide an upper storage tray 30a and upper horizontal movement mechanism 50, by the provision of these, stability during movement (feeding) of storage tray 30 can be increased.

Horizontal movement drive rods 62 are provided on the underside of lower storage tray 30b as the lower horizontal movement mechanism 60. Two parallel horizontal movement drive rods 62 are provided (only one visible in the drawing), the horizontal separation thereof being shorter than the width of the lower storage tray 30b. A horizontal movement drive source, not shown, is connected with horizontal movement drive rods 62. Also, drive rod holders 64 through which horizontal movement drive rods 62 are inserted are provided on the undersurface of lower storage tray 30b, these drive rod holders 64 being provided on rotary base 40.

Also, guide rods 52 are provided on the upper side of upper storage tray 30a as upper horizontal movement mechanism 50. Two such guide rods 52 are juxtaposed (only one visible in the drawing), the parallel separation thereof being shorter than the width of upper storage tray 30a. Also, guide rod holders 54 through which guide rods 52 are inserted are provided on the upper surface of upper storage tray 30a.

When the horizontal movement drive source, not shown, is driven, its drive force is transmitted to drive rod holders 64 through the horizontal movement drive rods 62. Thus, when the lower storage tray 30b is moved in the horizontal direction by this drive force, it moves integrally with lower storage tray 30b, whilst upper storage tray 30a is also guided by guide rods 52.

In this way, storage tray 30 is moved horizontally to a substrate feed position in which substrate movement can be performed mutually between all of the substrate processing chambers, between the load lock chambers, or between the substrate processing chambers and load lock chambers. In this substrate feed position, feeding in/out of a substrate holding tray is performed continuously by means of a series of horizontal movements.

It should be noted that the horizontal movement mechanism 55 comprising the upper horizontal movement mechanism 50 and lower horizontal movement mechanism 60 could be for example a movement mechanism comprising a rack-and-pinion or other movement mechanism, so long as it has the capability of achieving horizontal movement of a storage tray 30 as described above.

2-4-2. Construction of the Rotary Movement Mechanism

As shown in FIG. 2, substrate feed chamber 12 may be provided with a rotary movement mechanism constituted by a rotary drive mechanism 70.

Specifically, rotary drive mechanism 70 comprises a rotary base 40, rotary drive shaft 72 and rotary drive source 74. Rotary base 40 is arranged parallel with the horizontal plane and rotary drive shaft 72 is provided in a direction perpendicular to the horizontal plane. A rotary drive source 74 that rotates rotary drive shaft 72 is connected with rotary drive shaft 72. In this case, rotary drive source 74 may be provided outside substrate feed chamber 12. Also, the axial position of rotary drive shaft 72 coincides with the central axis of rotary base 40, so that rotary drive shaft 72 also coincides with the central axis of storage tray 30.

Now when rotary drive source 74 is driven, rotary drive shaft 72 is rotated in linked fashion therewith. Thus rotary base 40 is rotated by the rotation of rotary drive shaft 72.

Also, rotation is performed in a condition in which storage tray 30 is arranged in the initial position as described above. As a result, the radius of rotation is a minimum and reduction in the size of substrate feed chamber 12 can be achieved.

In this way, storage tray 30 is rotated into a substrate feed position in which movement of the substrate can be performed mutually between substrate processing chambers, load lock chambers or between substrate processing chambers and load lock chambers. In this substrate feed position, feeding in/out of the substrate holding tray can be performed continuously by a series of rotary and horizontal movements.

Also, thanks to the provision of horizontal movement mechanism 55 and rotary drive mechanism 70 in the construction of substrate feed chamber 12, feeding in/out of a substrate holding tray with respect to all of the processing chambers and load lock chambers arranged around substrate feed chamber 12 can be performed with very considerably increased efficiency.

2-4-3. Construction of Substrate Holding Trays

Substrate holding trays 28 according to the present invention comprises substrate holding means 80 that holds a substrate (not shown) in a substantially vertical condition.

In more detail, substrate holding means 80 comprises a pair of holding plates 82 that hold a substrate (not shown), a holding plate fixing section 84 that fixes holding plate 82 and a substrate holding section 86 that fixes the periphery (circumference) of a substrate that is held on holding plate 82. A square window (not shown) is formed in holding plate 82, the substrate being held so as to block this window.

Specifically, with a single substrate holding tray, two substrates can be fed simultaneously with their substrate services being put in a vertical or substantially vertical condition (this is also called a vertical feed arrangement).

Also, by feeding substrates in a perpendicular or substantially perpendicular condition, the area occupied by the substrates in the horizontal plane can be greatly diminished compared with the case where the substrates are fed in a horizontal condition.

In this way, increase in the installation area (footprint) of the substrate processing apparatus as a whole can be suppressed and reduction in size of the device achieved, thereby making it possible to reduce operating costs or running costs of the device itself.

Furthermore, by holding the substrates in a vertical or substantially vertical condition, flexure produced in the substrates can be prevented. Non-uniformity of processing can thereby be suppressed and product yields increased.

Also, substrate feed chamber 12 is provided with heating means constituted by a heater. That is, it may be constituted by a heater 91 in a form with a lamp heater 90 embedded in a heater embedding member 92 provided in substrate feed chamber 12. Heater embedding member 92 is moved parallel with horizontal movement mechanism 55 by means of guide rods 93 provided above the upper horizontal movement mechanism 50.

Also, if a substrate (not shown) is held on holding plate 82, since the substrate as described above is fixed in a position such as to block the window of holding plate 82, two substrates can be directly heated from the inside by lamp heater 90.

Also, by adopting a construction in which a heater 91 is provided in substrate feed chamber 12, occasional heating of the substrates (pre-heating) can be performed in substrate feed chamber 12 whilst they are waiting for the substrate holding tray to feed them to the substrate processing chamber 16, so the processing efficiency of deposition processing etc in substrate processing chamber 16 can be improved.

The reason for this is that, if glass substrates are employed for the substrates, a long time is required for heating the glass substrates up to the temperature of the treatment condition. However, by providing heating means within substrate feed chamber 12, the substrates can be thoroughly heated prior to deposition processing of the substrates. Consequently, the heating time in respect of the substrates in substrate processing chamber 16 can be shortened and, as a result, the processing time can be shortened.

Also, heater 91 could be replaced by cooling means that cools the substrate, such as a cooling plate.

Since the substrate temperature immediately after feeding out from substrate processing chamber 16 is high, if the substrate were to be fed out to a load station (not shown) without being subjected to cooling treatment etc (or if the cooling treatment performed in second load lock chamber 22 etc is insufficient) cracks or denaturing etc of the substrate might be produced.

These problems may therefore be avoided by suitably cooling the substrate by providing a cooling plate in the substrate feed chamber.

From the point of view of improving throughput, heating means and/or cooling means are preferably suitably provided in accordance with the processing conditions of the substrate within substrate feed chamber 12.

Also, tray guide rollers 32 are provided at the top and bottom of substrate holding trays 28 and guide rails 34 having grooves into which the tray guide rollers 32 can fit are formed in the upper storage tray 30a and lower storage tray 30b described above.

Thus, movement of the substrate between substrate holding trays 28 and the desired processing chamber or load lock chamber can be achieved by movement of tray guide rollers 32 along these grooves.

Second Embodiment

Figure 4A:
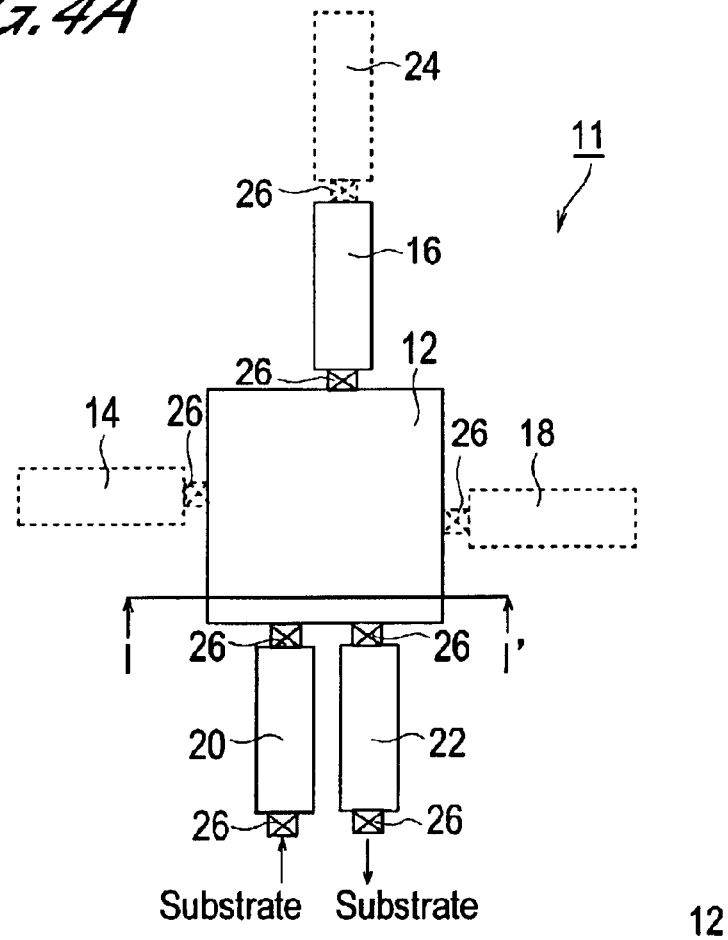
FIG. 4A is a diagrammatic plan view of an example of the construction of a substrate processing apparatus according to a second embodiment of the present invention.
Figure 4B:
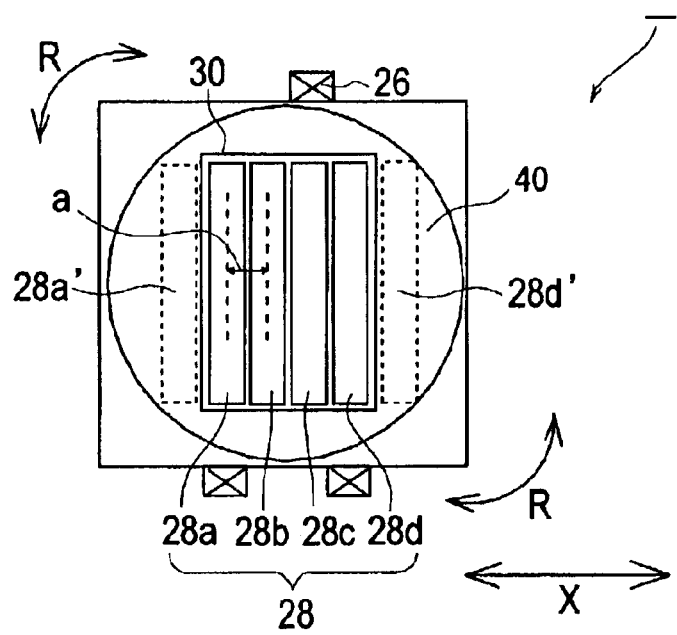
FIG. 4B is a diagrammatic plan view given in explanation of a substrate feed chamber according to a second embodiment of the present invention.

FIGS. 4A and 4B are views showing diagrammatically an example of the construction of a second substrate processing apparatus 11 according to this embodiment. FIG. 4A is a diagrammatic plan view of second substrate processing apparatus 11 and FIG. 4B is a diagrammatic plan view given in explanation of substrate feed chamber 12 in FIG. 4A.

As shown in FIG. 4A, second substrate processing apparatus 11 comprises, just as in the case of the first embodiment, a substrate feed chamber 12, substrate processing chamber 16, first load lock chamber 20, second load lock chamber 22, horizontal movement mechanism and rotary movement mechanism.

Figure 5:
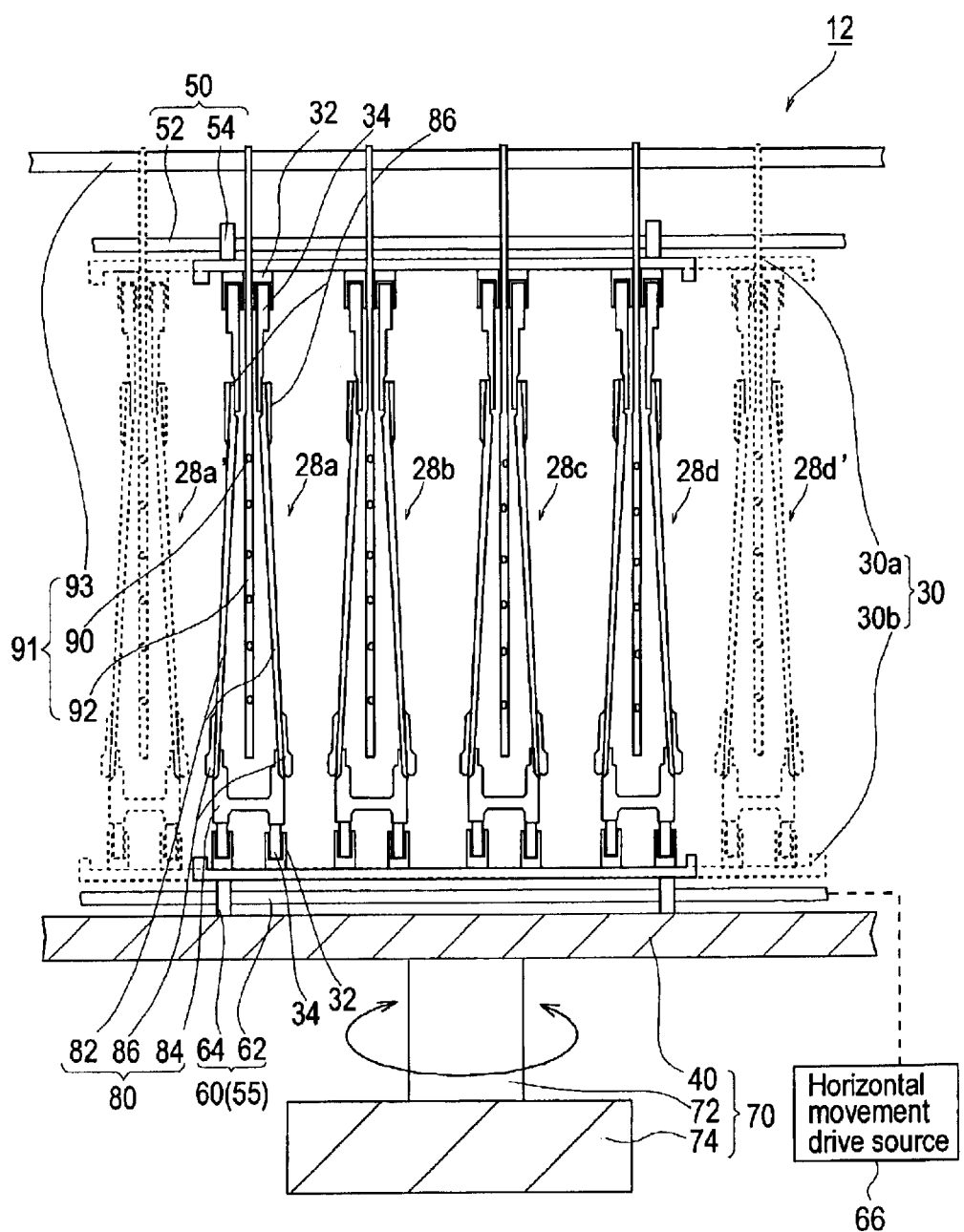
FIG. 5 is a diagrammatic partial cross-sectional view of a substrate feed chamber according to a second embodiment, sectioned along the line I–I' of FIG. 4A.

However, the substrate feed chamber 12 in the second substrate processing apparatus 11 differs from that of the first embodiment (see FIG. 5) in that storage tray 30 is of a construction whereby four, first to fourth, substrate holding trays (28a, 28b, 28c, 28d) can be stored in a parallel arrangement simultaneously. Its chief other structural features are fundamentally the same as in the case of the first embodiment, so further description thereof is omitted.

Also, the substrate feeding position in second substrate processing apparatus 11 corresponds to the position of substrate holding tray 28c, when this is between substrate feeding chamber 12 and substrate processing chamber 16. At this point, the position of the substrate holding tray 28c is the initial position of storage tray 30 (see FIG. 4B).

Thus, in the same way as in the first embodiment, the holding tray can be moved by positioning the substrate holding tray at the position of the substrate holding tray 28c by means of the horizontal movement mechanism and rotary movement mechanism and effecting mutually linked movement of the feed system with which the substrate holding trays are provided and the feed system with which the substrate processing chamber 16 is provided.

Also, when between the substrate feed chamber 12 and first load lock chamber 20, the substrate feed position corresponds to the position of the substrate holding tray 28a at the initial position of storage tray 30 and, when between the substrate feed chamber 12 and second load lock chamber 22 corresponds to the position of the substrate holding tray 28d (see FIG. 4B). In this case, the position of the substrate holding tray 28d is the initial position of storage tray 30.

Thus, in the same way as in the case of the first embodiment, the substrate holding tray is arranged in the position of the substrate holding tray 28a or 28d by horizontal movement mechanism and rotary movement mechanism and the substrate holding tray is capable of movement by mutually linked movement of the feed mechanism with which the substrate holding tray is provided and the feed mechanism with which the first load lock chamber 20 or second load lock chamber 22 is provided. It should be noted that the substrate feed position in the substrate feed chamber 12 is not restricted to the example described above but could be altered at will in accordance with the construction or scale of the device.

As will be clear from the above description, with this embodiment, compared with the first embodiment, more substrate holding trays can be stored, so the substrate feeding/processing operations can be performed more efficiently.

Third Embodiment

Figure 6A:
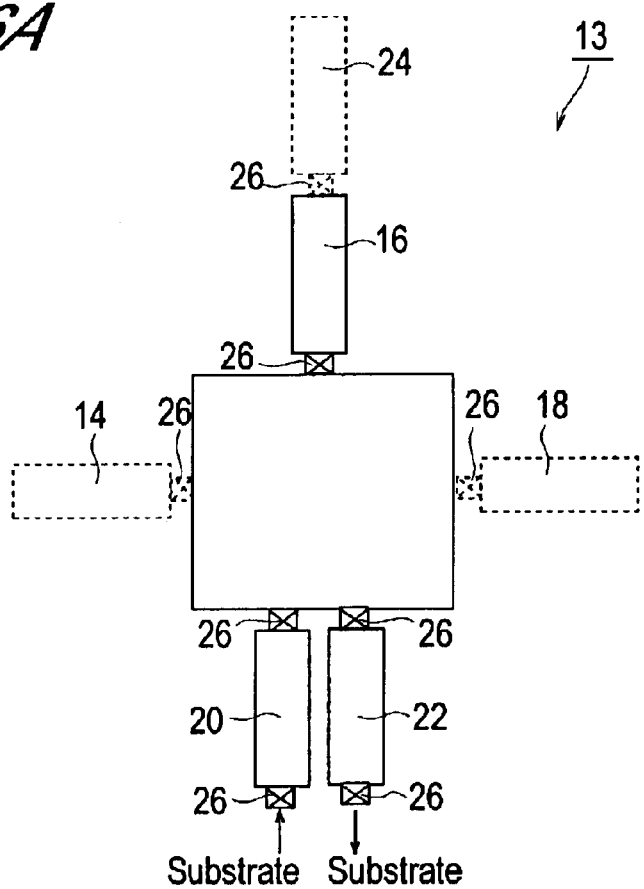
FIG. 6A is a diagrammatic plan view of an example of the construction of a substrate processing apparatus according to a third embodiment of the present invention.
Figure 6B:
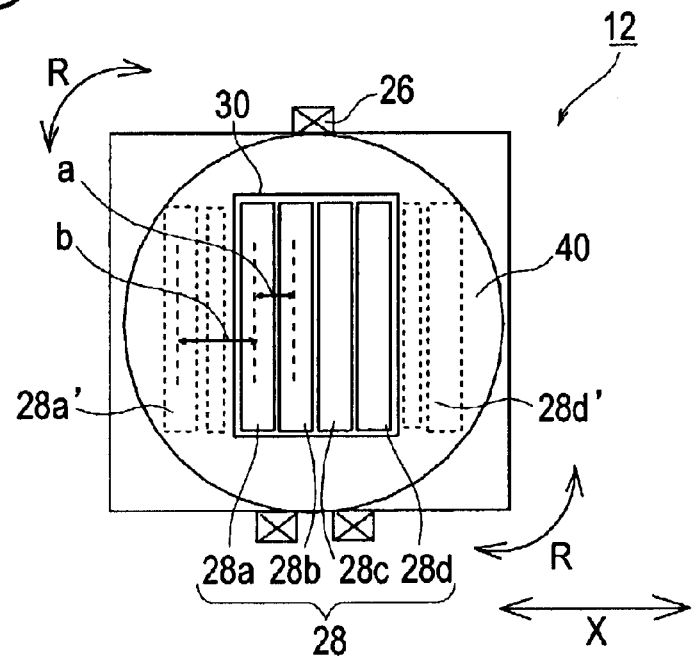
FIG. 6B is a diagrammatic plan view given in explanation of the initial position of a storage tray in a substrate feed chamber according to a third embodiment of the present invention.

FIGS. 6A and 6B are views showing diagrammatically a constructional example of a third substrate processing apparatus 13 according to the present invention. FIG. 6A is a diagrammatic plan view of a third substrate processing apparatus 13 and FIG. 6B is a diagrammatic plan view given in explanation of substrate feed chamber 12 in FIG. 6A.

As shown in FIG. 6A, third substrate processing apparatus 13, just as in the case of the first embodiment, comprises a substrate feed chamber 12, substrate processing chamber 16, first load lock chamber 20, second load lock chamber 22, horizontal movement mechanism and rotary movement mechanism.

However, the horizontal movement mechanism in the third substrate processing apparatus 13 row differs from that of the first and second embodiments not only in that the storage tray 30 has a construction that is capable of storing four, first to fourth, substrate holding trays (28a, 28b, 28c, 28d) simultaneously, but also in that storage tray 30 has a construction that is capable of movement by ±1.5 units in the horizontal direction (X direction) from the initial position i.e. by 1.5 steps respectively to left or right in the X direction. Its chief other structural features are fundamentally the same as in the case of the first and second embodiments, so further description thereof is omitted.

As shown in FIG. 6B, if the distance a between the centers of adjacent substrate holding trays is taken as one unit, for example the distance b between the centers of substrate holding tray 28a and substrate holding tray 28a' (to be described in detail later) is taken as 1.5 units (=1.5 a) (however, FIG. 6B is only diagrammatic and does not indicate the exact arrangement relationship).

Also, the initial position of storage tray 30 in substrate feed chamber 12 can be set at will just as in the case of the first embodiment, but, in the present description, as an example, this initial position is set as a middle position capable of movement by an amount of 1.5 steps to left or right, i.e. it is set at the position of storage tray 30 illustrated in FIG. 6B.

That is, when, by means of the horizontal movement mechanism described above, storage tray 30 is moved by −1.5 units (1.5 units in the left-hand direction in the drawing) in the horizontal direction from the initial position, substrate holding tray 28a is positioned at 28a' and when it is moved by +1.5 units (1.5 units in the right-hand direction in the drawing) in the horizontal direction from the initial position, substrate holding tray 28d is positioned at 28d' (see FIG. 6B).

Figure 7:
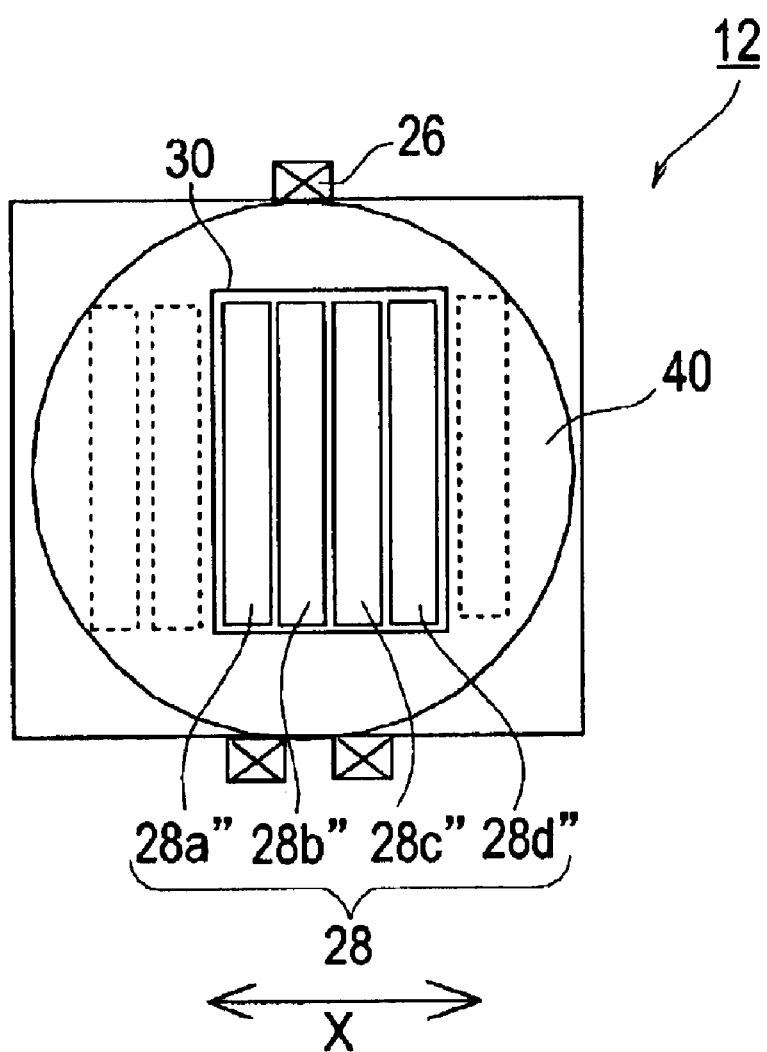
FIG. 7 is a diagrammatic plan view given in explanation of another initial position of the storage tray in the substrate feed chamber according to a third embodiment of the present invention.

Also, between the substrate feed chamber 12 and substrate processing chamber 16, the substrate feed position in the third substrate processing apparatus 13, describing the case of the substrate holding tray 28b, corresponds to a substrate holding tray position 28b" as shown in FIG. 7, moved by +0.5 unit (0.5 unit in the right-hand direction of the drawing) in the horizontal direction from the initial position.

Thus, the substrate holding tray is arranged at the position of substrate holding tray 28b" by the horizontal movement mechanism and rotary movement mechanism and the substrate holding tray can be moved by mutual linked movement of the feed system with which the substrate holding tray is provided and the feed system with which the substrate processing chamber 16 is provided.

Also, when between the substrate feed chamber 12 and first load lock chamber 20, the substrate feed position, as described with reference to the condition of FIG. 7, corresponds to the position of substrate holding tray 28a' and, when between substrate feed chamber 12 and second load lock chamber 22, corresponds to the position of substrate holding tray 28c".

Thus, in the same way as in the first and second embodiments, the substrate holding tray is arranged in the position of substrate holding tray 28a" or 28c" by the horizontal movement mechanism and rotary movement mechanism and the substrate holding tray is capable of being moved by linked movement of the feed systems with which the substrate holding tray and first load lock chamber 20 or second load lock chamber 22 are provided. The substrate feed position in substrate feed chamber 12 is not restricted to those described above but could be altered at will, depending on the construction or scale of the device.

As will be clear from the above description, in this embodiment, the degrees of freedom of the horizontal direction of the substrate are increased compared with the second embodiment, so the substrate feeding operation can be performed even more efficiently.

3. Example of Operation of the Substrate Processing Apparatus

Specific examples of the operation of feed systems of the first to third substrate processing apparatuses in accordance with the above construction are described with reference to FIG. 8A to FIG. 15E. It should be noted that FIG. 8A to FIG. 15E are diagrammatic plan views are given in explanation of the operation of, in particular, substrate feed chamber 12 of the substrate processing chambers, and so do not necessarily correspond with the actual design ratios. Also, the operation described is merely a suitable example, to which the present invention is not limited. Also, for convenience in description, the first load lock chamber 20 and second load lock chamber 22 also serve for feeding in/out of substrates from a load station, not shown.

Also, although, hereinbelow, in describing the construction using the horizontal movement mechanism and rotary movement mechanism, the simplest construction of substrate processing apparatus 10 was assumed, in which a single substrate processing chamber 16 is arranged adjacent to substrate feed chamber 12, depending on the type of processing of the substrate, other substrate processing chambers (14, 18, 24) could be added if required (see FIG. 1A).

Also, in the description of the feed operation of the substrate, a typical substrate processing action that is common to the examples of operation of the various substrate processing apparatuses is as described below; this description will not be repeated in the respective operating descriptions hereinbelow.

3-1 Basic Processing Operation in the Substrate Processing Apparatuses (Example)

First of all, an unprocessed substrate is fed in from a load station, not shown, through gate valve 26, to first or second load chamber (20, 22) (in this case, first load chamber 20 will be assumed). Also, movement of the substrate in this case is performed under atmospheric pressure through the load station and first load lock chamber 20. Also, after feeding in of the substrate, the gate valve 26 between the load station and the prescribed load lock chamber is closed.

Next, the load lock chamber in question (gate valve 26 between the load lock chamber and the substrate feed chamber is closed at this point) is evacuated and the unprocessed substrate that has been fed into the prescribed load lock chamber is exposed to the vacuum atmosphere.

Gate valve 26 between substrate feed chamber 12 and first load lock chamber 20 is then opened, and transfer of two substrates is performed by feeding out a desired substrate holding tray T from substrate feed chamber 12 under vacuum atmosphere. Tray T for holding the desired substrates, that carries the substrates, is then returned to substrate feed chamber 12.

Gate valve 26 between substrate feed chamber 12 and first load lock chamber 20 is then closed and first load lock chamber 20 is prepared for feeding in of the next unprocessed substrates and exposed to the atmosphere.

It should be noted that transfer of substrate holding tray T for the substrates is conducted under a vacuum atmosphere and substrate holding tray T is never exposed to the atmospheric atmosphere. Also, the substrates are fed and processed within the device in a condition placed on substrate holding tray T.

Substrates stored in substrate feed chamber 12 are fed out, as appropriate, to substrate processing chamber 16 under vacuum atmosphere by opening gate valve 26 between substrate feed chamber 12 and substrate processing chamber 16. Prescribed processing such as deposition is then conducted simultaneously on two substrates that have been fed in after closure of this gate valve 26.

When processing in substrate processing chamber 16 has been completed, gate valve 26 between substrate feed chamber 12 and substrate processing chamber 16 is opened and the processed substrates are fed to substrate feed chamber 12 under vacuum atmosphere. This gate valve 26 is then closed.

Gate valve 26 between substrate feed chamber 12 and first or second load lock chamber (20, 22) (in this case assumed to be second load lock chamber 22) is then opened and the processed substrate is fed out to the second load lock chamber 22 under vacuum atmosphere. After this, the gate valve 26 is closed.

Second load lock chamber 22 is then opened to the atmosphere, after which the processed substrate is fed out to a load station, not shown, through a gate valve 26. The series of substrate processing steps is then terminated.

It should be noted that the substrate processing steps described above were described merely for a construction wherein there is only a single substrate processing chamber; if further substrate processing chambers etc are added in accordance with the type of processing of the substrate, the substrate is fed out to the load station after feeding to a suitable prescribed substrate processing chamber.

3-2. Example of Operation of a First Substrate Processing Apparatus (Driving only the Horizontal Movement Mechanism)

An example of the operation of a feed system in a first substrate processing apparatus is described below with reference to FIG. 8A to FIG. 10E. In this case, the feed operation of a substrate using only a horizontal movement mechanism will be illustrated, referring to the operation of a horizontal movement mechanism incorporated in a first substrate processing apparatus.

In first substrate processing apparatus 10, three, first to third, substrate holding trays (T1, T2 and T3) having a construction as described above but not carrying a substrate are arranged within substrate feed chamber 12 (the positions of the substrate holding trays at this point correspond to the initial positions).

In this condition, two substrates 15 are fed in (see FIG. 8A) under atmospheric pressure into first load lock chamber 20.

After this, first substrate holding tray (T1) is fed out into first load lock chamber 20, which has been evacuated to vacuum and two substrates 15 are placed on first substrate holding tray (T1) (hereinbelow, a substrate holding tray (T1) on which substrates have been placed will be denoted by (T1(s))). Also, two substrates 15 are fed into second load lock chamber 22 (see FIG. 8B).

After this, substrate holding tray (T1(s)) is fed into substrate feed chamber 12 under vacuum atmosphere. Substrates 15 stored in substrate feed chamber 12 are heated (preheated) by a heater (not shown. See FIG. 2) arranged in the substrate feed chamber. Also, a third substrate holding tray (T3) is fed out into the second load lock chamber 22 that has been evacuated to vacuum and two substrates 15 are placed on third substrate holding tray (T3) (see FIG. 8C).

After this, two substrates 15 are fed into first load lock chamber 20. Also, substrate holding tray (T3(s)) is fed into substrate feed chamber 12 under vacuum atmosphere. The substrates 15 that have been stored in substrate feed chamber 12 are heated (preheated) (see FIG. 8D) by a heater (not shown. See FIG. 2) provided in the substrate feed chamber.

The storage tray (not shown) is then moved (see FIG. 8E) by the amount of +1 unit (1 unit in the right-hand direction in the drawing) in the horizontal direction (X direction) by the horizontal movement mechanism according to the present invention described above.

After this, first substrate holding tray (T1(s)) holding substrates preheated to a prescribed temperature is fed out into substrate processing chamber 16, where prescribed deposition processing is simultaneously performed on the two substrates (see FIG. 9A).

In substrate feed chamber 12, the storage tray is moved by −2 units (two units in the left-hand direction in the drawing) in the horizontal direction (X direction) by the horizontal movement mechanism (see FIG. 9B).

After this, second substrate holding tray (T2) is fed out into first load lock chamber 20 that has been evacuated to vacuum and two substrates 15 are placed on second substrate holding tray (T2) (see FIG. 9C).

Substrate holding tray (T2(s)) is then fed into substrate feed chamber 12, under vacuum atmosphere. Substrates 15 that have been stored in substrate feed chamber 12 are then heated (preheated) by a heater (not shown. See FIG. 2) provided in the substrate feed chamber. Also, the storage tray is moved by the horizontal movement mechanism by an amount of +2 units (2 units in the right-hand direction in the drawing) in the horizontal direction (X direction (see FIG. 9D).

After this, a substrate holding tray (denoted by T1(s)D) provided with a substrate that has been subjected to deposition processing is fed out into a region of a storage tray when no substrate holding trays are stored (i.e. a region such as indicated by the broken-line rectangle of FIG. 9D where substrate holding tray (T1(s)) was arranged in the preceding step) (see FIG. 9E).

After this, the storage tray is moved by −2 units (2 units in the left-hand direction in the drawing) in the horizontal direction (X direction) by the horizontal movement mechanism. Third substrate holding tray (T3(s)) whose substrates have been preheated is fed out into substrate processing chamber 16 and prescribed deposition processing is performed on the substrates (see FIG. 10A).

After this, the storage tray is moved by +1 unit (1 unit in the right-hand direction in the drawing) in the horizontal direction (X direction) by the horizontal movement mechanism and substrate holding tray (T1(s)D) is fed out into first load lock chamber 20 (see FIG. 10B).

The processed substrates are then recovered from the substrate holding tray (T1(s)D) that has been fed out into first load lock chamber 20. First substrate holding tray T1 is then returned to substrate feed chamber 12 (see FIG. 10C).

Two substrates 15 are then fed into first load lock chamber 20. Also, by the horizontal movement mechanism, the storage tray is moved by −1 unit (1 unit in the left-hand direction in the drawing) in the horizontal direction (X direction) and the substrate holding tray (T3(s)D) holding two processed substrates is fed out into a region of the storage tray where no substrate holding trays are stored (i.e. the region where substrate holding tray (T3(s)) was arranged in the preceding step) (see FIG. 10D).

After this, the storage tray is moved by +1 unit (1 unit in the right-hand direction in the drawing) in the horizontal direction (X direction) by the horizontal movement mechanism. First substrate holding tray (T2(s)) whose substrates have been preheated is then fed out into substrate processing chamber 16 and gate valve 26 between substrate processing chamber 16 and substrate feed chamber 12 is closed and prescribed deposition processing is performed on the substrates.

Substrate holding tray (T3(s)D) is fed out into second load lock chamber 22. The processed substrates are then recovered (see FIG. 10E) from the substrate holding tray (T3(s)D) that was fed out into the second load lock chamber 22.

Processing of the substrates is thereafter sequentially performed by repeating such operations and feeding the substrate holding tray into the substrate processing chamber 16 via the substrate feed chamber 12.

3-3. Example of Operation of Second Substrate Processing Apparatus (Where Both the Horizontal Movement Mechanism and Rotary Movement Mechanism are Driven)

An example of the operation of the feed system in the second substrate processing apparatus 11 is described below with reference to FIG. 11A to FIG. 13E. Specifically, a substrate feed operation using the horizontal movement mechanism and rotary movement mechanism with which the second substrate processing apparatus 11 is provided is illustrated.

In the second substrate processing apparatus 11, first of all, four, first to fourth, substrate holding trays (T1, T2, T3 and T4) having a construction as described above, with no substrates placed thereon, are fed into substrate feed chamber 12 (the positions of the substrate holding trays at this point correspond to the initial positions).

In this condition, two substrates 15 are fed into first load lock chamber 20 from a load station, not shown, under atmospheric pressure. Also, second load lock chamber 22 is also opened to the atmosphere at normal pressure (see FIG. 11A).

First load lock chamber 20 is then evacuated to vacuum at prescribed pressure by evacuation means, not shown. The first substrate holding tray T1 of substrate feed chamber 12 under vacuum is then fed out into first load lock chamber 20 and two substrates 15 are placed on first substrate holding tray (T1). Also, two substrates 15 are fed into a second load lock chamber 22 from a load station (see FIG. 11B).

First substrate holding tray (T1(s)) is then fed into substrate feed chamber 12. The substrates 15 stored in substrate feed chamber 12 are then heated (preheated) by a heater (not shown. See FIG. 2) provided in the substrate feed chamber. Also, fourth substrate holding tray (T4) is fed out from substrate feed chamber 12 into second load lock chamber 22 which has been evacuated to vacuum and substrates 15 are placed on fourth substrate holding tray (T4) (see FIG. 11C).

Fourth substrate holding tray T4(s) is then fed into substrate feed chamber 12. Also, two fresh substrates 15 are fed into first load lock chamber 20 (see FIG. 11D).

After this, by driving the rotary movement mechanism (not shown) according to the present invention described above, the storage tray (not shown) is rotated by 180° (this rotation is performed in a condition in which the storage tray has been returned to the initial position, as already described). Also, two fresh substrates 15 are fed into second load lock chamber 22 (see FIG. 11E).

After this, by the horizontal movement mechanism according to the present invention as already described, the storage tray (not shown) is moved by −1 unit (1 unit in the left-hand direction in the drawing) in the horizontal direction (X direction) (see FIG. 12A).

After this, first substrate holding tray (T1(s)) whose substrates have already been preheated is fed into substrate processing chamber 16, where prescribed deposition processing is performed on the substrates. Also, two substrates 15 are placed on the third substrate holding tray (T3) which has been fed into first load lock chamber 20 from substrate feed chamber 12 (see FIG. 12B).

After this, third substrate holding tray T3(s) is fed into substrate feed chamber 12 (see FIG. 12C).

After this, the storage tray is moved by the horizontal movement mechanism by +2 units (2 units in the right-hand direction in the drawing) in the horizontal direction (X direction). Two substrates 15 are then placed on the second substrate holding tray T2 that has been fed out from substrate feed chamber 12 to second load lock chamber 22 (see FIG. 12D).

After this, the second substrate holding tray (T2(s)) is fed into the substrate feed chamber 12 by a feed system, not shown (see FIG. 12E).

The storage tray 30 is then moved by −2 units (2 units in the left-hand direction in the drawing) in the horizontal direction (X direction) by the horizontal movement mechanism (see FIG. 13A).

After this, the substrate holding tray (T1(s)D) holding two processed substrates is fed out into a region of the storage tray where no substrate holding trays are stored (i.e. a region shown in FIG. 13A by the broken-line rectangle where substrate holding tray (T1(s)) was arranged in the preceding step) (see FIG. 13B).

After this, the storage tray is returned to its initial position by being moved by +1 unit (1 unit in the rightwards direction in the drawing) in the horizontal direction (X direction) by the horizontal movement mechanism and storage tray 30 is then again rotated by 180° by the rotary movement mechanism. The storage tray is then again moved by −1 unit (1 unit in the leftwards direction in the drawing) in the horizontal direction (X direction) by the horizontal movement mechanism. Substrate holding tray T4(s) on which substrates have been placed is then fed out into substrate processing chamber 16 by a feed system, not shown, and processing is commenced (see FIG. 13C).

After this, the storage tray is moved by +1 unit (1 unit in the right-hand direction in the drawing) in the horizontal direction (X direction) by the horizontal movement mechanism and substrate holding tray (T1(s)D) is then fed out into first load lock chamber 20 (see FIG. 13D).

After this, the processed substrates are recovered from substrate holding tray (T1(s)D) which was fed out into first load lock chamber 20. The first substrate holding tray T1 is then returned to the substrate feed chamber 12 and two fresh substrates 15 are fed into first load lock chamber 20 which is open to the atmosphere (see FIG. 13E).

Thereafter, processing of the substrates is sequentially performed by repeating operation as above and feeding substrate holding trays into substrate processing chamber 16 through substrate feed chamber 12.

3-4. Example of Operation of Third Substrate Processing Apparatus (Driving Horizontal Movement Mechanism+ Rotary Movement Mechanism)

An example of the operation of the feed system in the third substrate processing apparatus 13 will now be described with reference to FIG. 14A to FIG. 15E. Specifically, the substrate feed operation using the substrate horizontal movement mechanism and rotary movement mechanism with which the third substrate processing apparatus 13 is provided is illustrated.

First of all, in third substrate processing apparatus 13, four, first to fourth, substrate holding trays (T1, T2, T3 and T4) on which no substrate is yet placed are arranged within substrate feed chamber 12.

In this condition, two substrates 15 are fed into first load lock chamber 20 under atmospheric atmosphere. The second load lock chamber 22 is also exposed to the atmospheric atmosphere (see FIG. 14A).

After this, the storage tray (not shown) is moved by +0.5 units in the horizontal direction (X direction) (0.5 unit in the rightwards direction in the drawing) by the horizontal movement mechanism. First substrate holding tray (T1) is fed from a substrate feed chamber 12 under vacuum into first load lock chamber 20 which has been subjected to a vacuum evacuation process and two substrates 15 are placed on first substrate holding tray (T1). Also, two substrates 15 are fed into second load lock chamber 22 (see FIG. 14B).

After this, first substrate holding tray (T1(s)) is fed into substrate feed chamber 12. The substrates 15 stored in substrate feed chamber 12 are then heated (preheated) by a heater (not shown. See FIG. 2) provided in the substrate feed chamber. The third substrate holding tray (T3) is also fed out from substrate feed chamber 12 into second load lock chamber 22 which has been evacuated to vacuum, and two substrates 15 are placed on third substrate holding tray (T3). Also, after the two substrates 15 have been fed in after it was opened to the atmosphere, first load lock chamber 20 is evacuated to vacuum (see FIG. 14C).

After this, third substrate holding tray (T3(s)) is fed into substrate feed chamber 12 under vacuum atmosphere. Also, after the storage tray has been moved by −1 unit (1 unit in the leftwards direction in the drawing) in the horizontal direction (X direction) by the horizontal movement mechanism, two substrates 15 are placed (T2(s)) on the second substrate holding tray (T2) that has been fed out from a substrate feed chamber 12 to the first load lock chamber 20. Also, two substrates 15 are fed into the second load lock chamber 22 (see FIG. 14D).

Substrate holding tray T2(s) is fed into substrate feed chamber 12 under vacuum. The substrates 15 stored in substrate feed chamber 12 are then heated (preheated) by a heater (not shown. See FIG. 2) provided in the substrate feed chamber. Also, two substrates 15 are fed into first load lock chamber 20 (see FIG. 14E).

After this, the storage tray is moved by +2 units (2 units in the rightwards direction in the drawing) in the horizontal direction (X direction) by the horizontal movement mechanism and substrate holding tray (T1(s)) is fed out into substrate processing chamber 16 where prescribed deposition processing is performed on the substrates (see FIG. 15A).

After this, the substrate holding tray (T1(s)D) on which is provided substrates that have been subjected to deposition processing is fed out into a region where no substrate holding trays are stored in the storage tray (i.e. a region indicated in FIG. 15A by the broken-line rectangle, where substrate holding tray (T1(s)) was arranged in the preceding step). Also, the storage tray is moved by −2 units (2 units in the leftwards direction in the drawing) in the horizontal direction (X direction) by the horizontal movement mechanism so that substrate holding tray (T3(s)) is fed out into substrate processing chamber 16 (see FIG. 15B).

After this, two substrates 15 are placed on the fourth substrate holding tray (T4) that was fed into the second load lock chamber 22 from substrate feed chamber 12 (see FIG. 15C).

After fourth substrate holding tray (T4(s)) has been fed into the substrate feed chamber 12 under vacuum, the storage tray is moved by +0.5 unit (0.5 unit in the rightwards direction in the drawing) in the horizontal direction (X direction) by the horizontal movement mechanism and thereby arranged in the initial position, after which the storage tray is rotated by 180° by the rotary movement mechanism. The storage tray is then moved by −0.5 unit (0.5 unit in the leftwards direction in the drawing) in the horizontal direction (X direction) by the horizontal movement mechanism so that substrate holding tray (T1(s)D) is fed out into the second load lock chamber 22 (see FIG. 15D).

After this, the processed substrates are recovered from substrate holding tray (T1(s)D) that was fed out to second load lock chamber 22. First substrate holding tray T1 is then returned to the substrate feed chamber 12 and two fresh substrates 15 are then fed into second load chamber 22 (see FIG. 15E).

Processing of the substrates is then sequentially performed by feeding substrate holding trays into substrate processing chamber 16 through substrate feed chamber 12 by repeating the above operations.

As described above, a substrate feed chamber according to the present invention has a construction capable of simultaneously storing at least three substrate holding trays (at least six substrates) and has a construction in which a rotary movement mechanism is provided in addition to the horizontal movement mechanism.

Thus, more substrates than conventionally can be stored in the substrate feed chamber and movement of the substrates mutually between substrate processing chambers, load lock chambers, or between substrate processing chambers and load lock chambers, all of which are arranged at the periphery of the substrate feed chamber, can be achieved in a smooth fashion without unnecessarily keeping the substrates waiting.

Consequently, by having an ample number of substrate holding trays standing by in the substrate feed chamber for example the time for feeding in of fresh substrates into the substrate processing chamber after processed substrates have been fed out can be reduced compared with conventionally.

The unit stepping time for substrate processing can therefore be reduced, making it possible to improve throughput.

Also, thorough heating (pre-heating) of the substrates can be achieved by the heating means arranged in the substrate feed chamber whilst the substrates are being fed into the substrate processing chamber, so the time required for performing the deposition processing can be shortened, making it possible to improve throughput. Also, there is no need to provide a heating chamber.

The conditions and construction in the embodiments of the present invention are not restricted to the combinations described above. The present invention can therefore be applied by suitable combinations of conditions in any desired appropriate steps.

As will be clear from the above description, with the substrate feed chamber and substrate processing apparatus according to the present invention, more substrates than conventionally can be simultaneously stored in the substrate feed chamber and the movement of feeding in or feeding out of substrates between the substrate processing chambers, between the load lock chambers or between the substrate processing chambers and load lock chambers can be performed in smooth fashion without making the substrates wait unnecessarily.

The unit stepping time for substrate processing can therefore be reduced, making it possible to improve throughput.

Also, due to the provision of heating and/or cooling means in the substrate feed chamber, there is no need to provide a dedicated heating chamber and/or dedicated cooling chamber and, due to the adoption of a vertical feed system, increase of the installation area (footprint) of the device as a whole can be restricted.

Also, even when a rotary movement mechanism is provided, the mechanism is one whereby rotation can be achieved in minimum radius, so increase in the capacity of the substrate feed chamber can be restricted.

What is claimed is:

1. A substrate feed chamber comprising:
   a substrate holding tray storage device capable of storing simultaneously three or more substrate holding trays that hold substrates in a vertical or substantially vertical condition;
   a horizontal movement mechanism that produces horizontal movement of said substrate holding tray storage device; and
   a rotary movement mechanism that rotates said substrate holding tray storage device about an axis perpendicular to the plane of the horizontal movement of said horizontal movement mechanism;
   wherein said horizontal movement mechanism effects horizontal movement of said substrate holding tray storage device with respect to the substrate feed position for performing feeding-in or feeding-out movement of said substrate holding tray between any of the chambers of a group of chambers consisting of one or more substrate processing chambers where a given processing is performed on said substrates and one or more load lock chambers where feeding in/out of said substrates between atmospheric atmosphere and vacuum atmosphere is performed.

2. The substrate feed chamber according to claim 1, wherein said substrate holding tray storage device is divided into a plurality.

3. The substrate feed chamber according to claim 1, comprising a heating device that heats said substrate.

4. The substrate feed chamber according to claim 1, comprising a cooling device that cools said substrate.

5. The substrate feed chamber according to claim 1, wherein two substrates are held by each one of said substrate holding trays.

6. The substrate feed chamber according to claim 1, said substrate feed chamber is provided in a substrate processing apparatus.

7. The substrate feed chamber according to claim 1, wherein said substrate holding tray storage device is constituted as a storage tray in which said substrate holding trays are juxtaposed; and wherein, if the distance between the centers of adjacent substrate holding trays is taken as 1 unit, then said storage tray is constituted so as to be capable of movement by units corresponding to an integral multiple of ±0.5 by said horizontal movement mechanism.

8. The substrate feed chamber according to claim 7, wherein each of said storage trays comprise a single constituent element or are divided into a plurality of two or more constituent elements.

9. The substrate feed chamber according to claim 7, wherein said storage tray is constituted by a first storage tray and second storage tray that clamp said substrate holding trays from above and below, and said horizontal movement mechanism is constituted by a first horizontal movement mechanism that drives said first storage tray and a second horizontal movement mechanism that drives said second storage tray.

10. The substrate feed chamber according to claim 9, wherein said first horizontal movement mechanism includes a guide rod holder provided on said first storage tray and a guide rod inserted into this guide rod holder, and said second horizontal movement mechanism includes a drive rod holder provided on said second storage tray, a horizontal movement drive rod inserted into this drive rod holder, and a horizontal movement drive source that drives this horizontal movement drive rod.

11. The substrate feed chamber according to claim 9, wherein said substrate holding tray comprises a first tray guide roller and a second tray guide roller, said first storage tray comprises a first guide rail that fits this first tray guide roller, and said second storage tray comprises a second guide rail that fits this second tray guide roller.

12. The substrate feed chamber according to claim 1, wherein said substrate holding tray storage device is constituted as a storage tray in which said substrate holding trays are juxtaposed, and wherein said rotary movement mechanism comprises a rotary movement drive source, a rotary movement drive axis coupled with said rotary movement drive source and a rotary base coupled with said rotary movement drive axis and on which said storage trays are placed.

13. The substrate feed chamber according to claim 1, wherein said substrate holding tray comprises a substrate holding device that holds said substrate in a substantially vertical condition.

14. The substrate feed chamber according to claim 13, wherein said substrate holding device further comprises:
a pair of holding plates having a window, which hold said substrate so as to block said window and are arranged in substantially vertical condition;
a holding plate fixing section that fixes said holding plates; and
a substrate fixing section that fixes the periphery of said substrate to said holding plates.

15. A substrate feed chamber comprising:
a substrate holding tray storage device positioned to operate within the substrate feed chamber and capable of storing simultaneously three or more substrate holding trays that hold substrates in a vertical or substantially vertical condition; and
a horizontal movement mechanism that produces horizontal movement of said substrate holding tray storage device within said substrate feed chamber;
wherein said horizontal movement mechanism effects horizontal movement of said substrate holding tray storage device with respect to the substrate feed position for performing feeding-in or feeding-out movement of said substrate holding tray between any of the chambers of a group of chambers consisting of one or more substrate processing chambers where a given processing is performed on said substrates and one or more load lock chambers where feeding in/out of said substrates between atmospheric atmosphere and vacuum atmosphere is performed.

16. The substrate feed chamber according to claim 15, further comprising a rotary movement mechanism that rotates said substrate holding tray storage device within said substrate feed chamber and about an axis perpendicular to the plane of the horizontal movement of said horizontal movement mechanism.

17. The substrate feed chamber according to claim 16, wherein said substrate holding tray storage device is constituted as a storage tray in which said substrate holding trays are juxtaposed, and wherein said rotary movement mechanism comprises a rotary movement drive source, and wherein a rotary movement drive axis coupled with said rotary movement drive source and a rotary base coupled with said rotary movement drive axis and on which said storage trays are placed.

18. The substrate feed chamber according to claim 15, wherein said substrate holding tray storage device is divided into a plurality.

19. The substrate feed chamber according to claim 15, comprising a heating device that heats said substrate.

20. The substrate feed chamber according to claim 15, comprising a cooling device that cools said substrate.

21. The substrate feed chamber according to claim 15, wherein two substrates are held by each one of said substrate holding trays.

22. The substrate feed chamber according to claim 15, said substrate feed chamber is provided in a substrate processing apparatus.

23. The substrate feed chamber according to claim 15, wherein said substrate holding tray storage device is constituted as a storage tray in which said substrate holding trays are juxtaposed, and wherein, if the distance between the centers of adjacent substrate holding trays is taken as 1 unit, then said storage tray is constituted so as to be capable of movement by units corresponding to an integral multiple of ±0.5 by said horizontal movement mechanism.

24. The substrate feed chamber according to claim 23, wherein each of said storage trays comprise a single constituent element or are divided into a plurality of two or more constituent elements.

25. The substrate feed chamber according to claim 23, wherein said storage tray is constituted by a first storage tray and second storage tray that clamp said substrate holding trays from above and below, and said horizontal movement mechanism is constituted by a first horizontal movement mechanism that drives said first storage tray and a second horizontal movement mechanism that drives said second storage tray.

26. The substrate feed chamber according to claim 25, wherein said first horizontal movement mechanism includes a guide rod holder provided on said first storage tray and a guide rod inserted into this guide rod holder, and said second horizontal movement mechanism includes a drive rod holder provided on said second storage tray, a horizontal movement drive rod inserted into this drive rod holder, and a horizontal movement drive source that drives this horizontal movement drive rod.

27. The substrate feed chamber according to claim 25, wherein said substrate holding tray comprises a first tray guide roller and a second tray guide roller, said first storage tray comprises a first guide rail that fits this first tray guide roller, and said second storage tray comprises a second guide rail that fits this second tray guide roller.

28. The substrate feed chamber according to claim 15, wherein said substrate holding tray comprises a substrate holding device that holds said substrate in a substantially vertical condition.

29. The substrate feed chamber according to claim 28, wherein said substrate holding device further comprises:

a pair of holding plates having a window, which hold said substrate so as to block said window and are arranged in substantially vertical condition;

a holding plate fixing section that fixes said holding plates; and a substrate fixing section that fixes the periphery of said substrate to said holding plates.

* * * * *